US011271676B2

(12) United States Patent
Mueck et al.

(10) Patent No.: US 11,271,676 B2
(45) Date of Patent: *Mar. 8, 2022

(54) MOBILE COMMUNICATION SYSTEM USING SUBCODING TECHNIQUES

(71) Applicant: Intel Corporation, Santa Clara, CA (US)

(72) Inventors: Markus Dominik Mueck, Unterhaching (DE); Christian Drewes, Germering (DE); Mark Sagi, Munich (DE)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/854,348

(22) Filed: Apr. 21, 2020

(65) Prior Publication Data

US 2021/0006351 A1    Jan. 7, 2021

Related U.S. Application Data

(63) Continuation of application No. 15/761,314, filed as application No. PCT/EP2016/069862 on Aug. 23, 2016, now Pat. No. 10,673,560.

(30) Foreign Application Priority Data

Sep. 24, 2015   (DE) .......................... 102015116157.5

(51) Int. Cl.
*H04L 1/00* (2006.01)
*H03M 13/11* (2006.01)
(Continued)

(52) U.S. Cl.
CPC ........ *H04L 1/0041* (2013.01); *H03M 13/036* (2013.01); *H03M 13/1102* (2013.01);
(Continued)

(58) Field of Classification Search
CPC ..... H04L 1/02; H04L 1/06; H04L 1/20; H04L 1/0041; H04L 1/045; H04L 1/0057;
(Continued)

(56) References Cited

U.S. PATENT DOCUMENTS

| 2010/0104044 A1* | 4/2010 | Kishigami | .......... H04L 27/2628 375/299 |
| 2010/0251057 A1* | 9/2010 | Hoshino | ................... H04L 1/06 714/749 |

FOREIGN PATENT DOCUMENTS

| EP | 2136474 A2 | 12/2009 |
| EP | 2136474 A3 | 9/2012 |

(Continued)

OTHER PUBLICATIONS

Roh et al., Millimeter-wave beamforming as an enabling technology for 5G Cellular Communications: Theoretical feasibility and prototype results, IEEE, 5G Wireless Communication systems, prospects and challenges, pp. 106 to 113. (Year: 2014).*

(Continued)

*Primary Examiner* — Shelly A Chase
(74) *Attorney, Agent, or Firm* — Schiff Hardin LLP

(57) ABSTRACT

The disclosure relates to a mobile communication system including: a first transmission path configured to transmit a message according to a first radio access technology; a second transmission path configured to transmit the message according to a second radio access technology; and an encoder configured to encode the message by a code before transmission of the message over the first transmission path and the second transmission path, wherein the code comprises at least two subcodes, and wherein the encoder is configured to encode the message intended for transmission over the first transmission path with a first subcode of the at least two subcodes and to encode the message intended for (Continued)

transmission over the second transmission path with a second subcode of the at least two subcodes.

13 Claims, 15 Drawing Sheets

(51) Int. Cl.
*H04W 88/06* (2009.01)
*H03M 13/37* (2006.01)
*H04L 1/02* (2006.01)
*H03M 13/03* (2006.01)
*H03M 13/35* (2006.01)
*H03M 13/00* (2006.01)
*H04L 1/20* (2006.01)

(52) U.S. Cl.
CPC ...... *H03M 13/116* (2013.01); *H03M 13/1148* (2013.01); *H03M 13/353* (2013.01); *H03M 13/3761* (2013.01); *H03M 13/616* (2013.01); *H04L 1/0045* (2013.01); *H04L 1/0057* (2013.01); *H04L 1/0058* (2013.01); *H04L 1/02* (2013.01); *H04L 1/20* (2013.01); *H04W 88/06* (2013.01); *H04L 2001/0096* (2013.01)

(58) Field of Classification Search
CPC ............. H03M 13/036; H03M 13/353; H03M 13/116; H03M 13/1148; H03M 13/1102
See application file for complete search history.

(56) References Cited

FOREIGN PATENT DOCUMENTS

WO 2010/083038 A2 7/2010
WO 2010/083038 A3 9/2010

OTHER PUBLICATIONS

Pi et al., System design and network architecture for a millimeter-wave mobile broadband (MMB) system, IEEE, pp. 1 to 6. (Year : 2011).*
Chinese Action dated Apr. 14, 2021, Application No. 201680049210.7.
F. Fekri, et al., "Nonuniform Error Correction Using Low-Density Parity-Check Codes", 13 pgs., IEEE Transactions on Information Theory, vol. 51, No. 7, Jul. 2005.
European Patent Office, PCT International Search Report issued for PCT/EP2016/069862,4 pgs., dated Nov. 24, 2016.
Zhang, et al., "Multi-Edge-Type Low Density Parity Check Cides for Bandwidth Efficient Modulation", 2013, IEEE, Trans. on Comm., vol. 61, No. 1, pp. 43-52.
Beltrao, et al., "Multi-Edge Type Unequal Error Protecting Low Density Parity Check Codes", 2011, IEEE, pp. 335-339.
Richardson, et al., "Multi-Edge Type LDPC Codes", Apr. 2004, IEEE, pp. 1-36.

* cited by examiner

MOBILE COMMUNICATION SYSTEM USING SUBCODING TECHNIQUES

FIELD

The disclosure relates to a mobile communication system using subcoding techniques, a mobile receiver using subcoding techniques, a method for generating a super LDPC (Low Density Parity Check) code and a method for generating a Multi-Edge LDPC code. In particular, the disclosure relates to techniques for joint channel coding for heterogeneous radio environments with respect to 5G networks, in particular to Multi-Edge LDPC coding for inter-cell-interference management, Multi-Edge LDPC coding sub-code selection and combination for joint multi-communication coding and optimization of degree distribution for Multi-Edge LDPC coding.

BACKGROUND

In mobile communication systems such as LTE (or beyond), interference from neighboring radio cells onto a serving radio cell typically reduces the SINR (Signal to Interference plus Noise Ratio) on those Resource Blocks of the serving cell(s) on which the neighboring cell(s) transmit(s) training sequences or data symbols. Known solutions use a channel code for coding the resource blocks in order to reduce the interference. Optimizations can be performed through suitable choice of constellations (e.g., BPSK, QPSK, QAM-16, QAM-64, etc.) or through a modification of the code rate through puncturing (e.g., R=½, ¾, etc.). As mobile communication systems steadily have to be improved there is a need to further reduce the interference from neighboring cells onto the serving cell.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

DETAILED DESCRIPTION

Figure 1A:
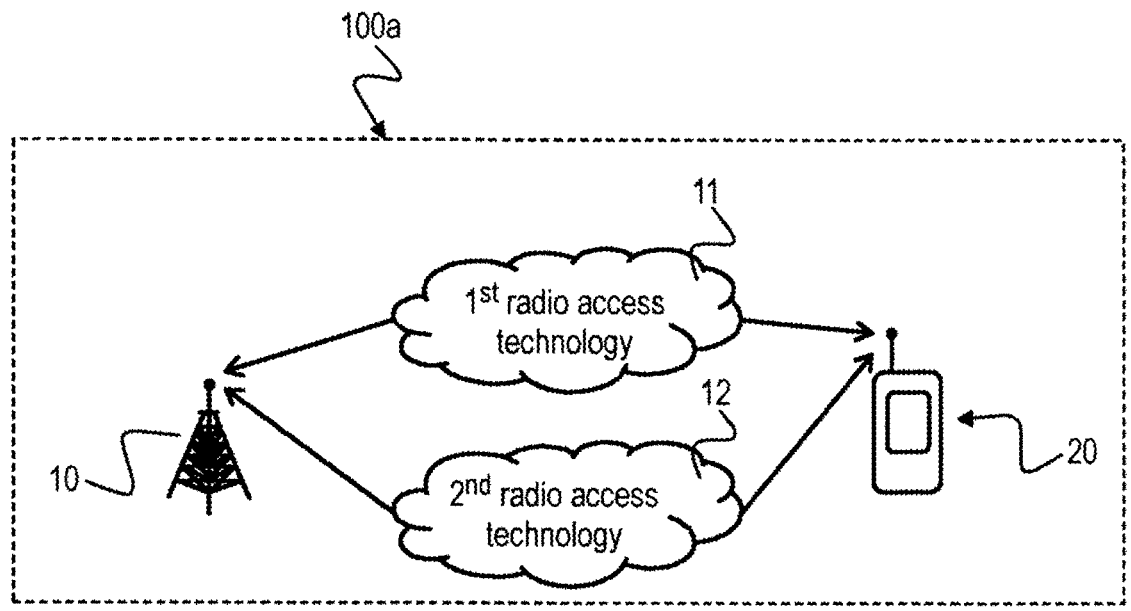
FIG. 1a is a system diagram illustrating a mobile communication system 100a including different Radio Access Technologies (RATs) 11, 12 for communication between a base station 10 and a mobile station 20

In the following detailed description, reference is made to the accompanying drawings, which form a part thereof, and in which is shown by way of illustration specific aspects in which the invention may be practiced. It is understood that other aspects may be utilized and structural or logical changes may be made without departing from the scope of the present invention. The following detailed description, therefore, is not to be taken in a limiting sense, and the scope of the present invention is defined by the appended claims.

The following terms, abbreviations and notations will be used herein:
3GPP: 3rd Generation Partnership Project,
LTE: Long Term Evolution,
LTE-A: LTE Advanced, Release 10 and higher versions of 3GPP LTE,
RF: Radio Frequency,
UE: User Equipment,
eNodeB,
eNB: base station,
MIMO: Multiple Input Multiple Output,
AP: Antenna Port,
LDPC: Low Density Parity Check,
DMRS: demodulation specific reference signal,
RE: resource element,
ABS: almost blank subframes,
(e)ICIC (enhanced) inter cell interference cancellation,
EXIT: extrinsic information transfer,
EMI: extrinsic mutual information,
CN: check node,
VN: variable node.

The methods, systems and devices described herein may apply LDPC coding. It is understood that comments made in connection with a described method may also hold true for a corresponding device configured to perform the method and vice versa. For example, if a specific method step is described, a corresponding device may include a unit to perform the described method step, even if such a unit is not explicitly described or illustrated in the figures. Further, it is understood that the features of the various exemplary aspects described herein may be combined with each other, unless specifically noted otherwise.

The methods, systems and devices described herein may be based on LDPC coding or any other code which can be represented in a graph such as the Tanner Graph. In iterative decoding, multiple decoders make estimations on c and exchange these estimations iteratively. LDPC codes are well suited for iterative decoding. The computational complexity of iterative decoding of LDPC codes grows linearly in n due to the sparsity of H. The two components of LDPC decoders are the variable nodes with their repetition code constraint and the check nodes with their single-parity check constraint. The parity check matrix can be represented as a bipartite graph called Tanner graph. A Tanner graph consists of a set of variable nodes V1; V2; : : : ; Vn, a set of check nodes C1; C2; : : : ; Cm and a set of edges E. Each column of H, i.e. codeword bit, is associated with a variable node. Each row of H, i.e. parity check equation, corresponds to a check node. The Tanner graph is useful to illustrate the iterative decoding process for LDPC codes. Variable nodes and check nodes estimate $û_i$ and send these estimations as messages along the edges of the Tanner graph. The iterative decoding performance is directly linked to the distribution of its node degrees. All codeword bit estimations are soft quantized and the variable node and check node component decoders are soft-input soft-output decoders. The channel inputs to variable nodes Vi are modeled as soft log-likelihood ratios (LLR).

The methods, systems and devices described herein may apply extrinsic information transfer (EXIT) analysis. Extrinsic information transfer (EXIT) analysis is a variant of single parameter Gaussian approximated density evolution (GA-DE) analysis. The single parameter used to track codeword estimation improvement is Gaussian approximated extrinsic mutual information (MI). Extrinsic information means, that a node receives information on its codeword bit which did not originate from the very same node. When variable node $v_i$ receives incorrect channel information $L_{ch,i}$ for the associated bit $ĉ_i$, it needs to receive sufficient extrinsic information from its adjacent check
nodes to correct the value of $ĉ_i$. The MI between the extrinsic messages arriving at $v_i$ and sent codeword bit $c_i$ has to converge to one for $l \to \infty$.

The methods, systems and devices described herein may be implemented in wireless communication networks, in particular communication networks based on mobile communication standards such as LTE, in particular 4G and 5G. The methods, systems and devices described below may be implemented in network nodes, base stations and mobile terminals. The described devices may include integrated circuits and/or passives and may be manufactured according to various technologies. For example, the circuits may be designed as logic integrated circuits, analog integrated circuits, mixed signal integrated circuits, optical circuits, memory circuits and/or integrated passives. Target wireless standards for which the technology according to this disclosure can be employed are in particular the following: cellular wide area radio communication technology (which may include e.g. 5th Generation (5G) communication systems, a Global System for Mobile Communications (GSM) radio communication technology, a General Packet Radio Service (CPRS) radio communication technology, an Enhanced Data Rates for GSM Evolution (EDGE) radio communication technology, and/or a Third Generation Partnership Project (3GPP) radio communication technology (e.g. UMTS (Universal Mobile Telecommunications System), FOMA (Freedom of Multimedia Access), 3GPP LTE (Long Term Evolution), 3GPP LTE Advanced (Long Term Evolution Advanced)), CDMA2000 (Code division multiple access 2000), CDPD (Cellular Digital Packet Data), Mobitex, 3G (Third Generation), CSD (Circuit Switched Data), HSCSD (High-Speed Circuit-Switched Data), UMTS (3G) (Universal Mobile Telecommunications System (Third Generation)), W-CDMA (UMTS) (Wideband Code Division Multiple Access (Universal Mobile Telecommunications System)), HSPA (High Speed Packet Access), HSDPA (High-Speed Downlink Packet Access), HSUPA (High-Speed Uplink Packet Access), HSPA+(High Speed Packet Access Plus), UMTS-TDD (Universal Mobile Telecommunications System—Time-Division Duplex), TD-CDMA (Time Division—Code Division Multiple Access), TD-CDMA (Time Division—Synchronous Code Division Multiple Access), 3GPP Rel. 8 (Pre-4G) (3rd Generation Partnership Project Release 8 (Pre-4th Generation)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel. 13 (3rd Generation Partnership Project Release 12), 3GPP Rel. 14 (3rd Generation Partnership Project Release 12), 3GPP LTE Extra, LTE Licensed-Assisted Access (LAA), UTRA (UMTS Terrestrial Radio Access), E-UTRA (Evolved UMTS Terrestrial Radio Access), LTE Advanced (4G) (Long Term Evolution Advanced (4th Generation)), cdmaOne (2G), CDMA2000 (3G) (Code division multiple access 2000 (Third generation)), EV-DO (Evolution-Data Optimized or Evolution-Data Only), AMPS (1G) (Advanced Mobile Phone System (1st Generation)), TACS/ETACS (Total Access Communication System/Extended Total Access Communication System), D-AMPS (2G) (Digital AMPS (2nd Generation)), PTT (Push-to-talk), MTS (Mobile Telephone System), IMTS (Improved Mobile Telephone System), AMTS (Advanced Mobile Telephone System), OLT (Norwegian for Offentlig Landmobil Telefoni, Public Land Mobile Telephony), MTD (Swedish abbreviation for Mobiltelefonisystem D, or Mobile telephony system D), Autotel/PALM (Public Automated Land Mobile), ARP (Finnish for Autoradiopuhelin, "car radio phone"), NMT (Nordic Mobile Telephony), Hicap (High capacity version of NTT (Nippon Telegraph and Telephone)), CDPD (Cellular Digital Packet Data), Mobitex, DataTAC, iDEN (Integrated Digital Enhanced Network), PDC (Personal Digital Cellular), CSD (Circuit Switched Data), PHS (Personal Handy-phone System), WiDEN (Wideband Integrated Digital Enhanced Network), iBurst, Unlicensed Mobile Access (UMA, also referred to as also referred to as 3GPP Generic Access Network, or GAN standard)), Wireless Gigabit Alliance (WiGig) standard, mmWave standards in general (wireless systems operating at 10-90 GHz and above such as WiGig, IEEE 802.11ad, IEEE 802.11ay, etc.), etc.

The methods and devices described herein may be configured to transmit and/or receive radio signals. Radio signals may be or may include radio frequency signals radiated by a radio transmitting device (or radio transmitter or sender) with a radio frequency lying in a range of about 3 Hz to 300 GHz. The frequency range may correspond to frequencies of alternating current electrical signals used to produce and detect radio waves.

The methods and devices described herein after may be designed in accordance to mobile communication standards such as e.g. the Long Term Evolution (LTE) standard or the advanced version LTE-A thereof. LTE (Long Term Evolution), marketed as 4G LTE and 5G LTE, is a standard for wireless communication of high-speed data for mobile phones and data terminals. The technology according to this disclosure can be employed in all systems employing LDPC codes (alone or together with other codes), such as for example IEEE 802.11n WiFi, IEEE 802.11ac WiFi, IEEE 802.16e WiMax, GMR-1, IEEE 802.3an, IEEE 802.22, CMMB, WiMedia 1.5, DVB-S2, Digital Terrestrial Multimedia Broadcast (DTMB), ITU-T G.hn, etc.

The methods and devices described hereinafter may be applied in OFDM systems. OFDM is a scheme for encoding digital data on multiple carrier frequencies. A large number of closely spaced orthogonal sub-carrier signals may be used to carry data. Due to the orthogonality of the sub-carriers crosstalk between sub-carriers may be suppressed.

The methods and devices described hereinafter may be applied in MIMO systems and diversity receivers. Multiple-input multiple-output (MIMO) wireless communication systems employ multiple antennas at the transmitter and/or at the receiver to increase system capacity and to achieve better quality of service. In spatial multiplexing mode, MIMO systems may reach higher peak data rates without increasing the bandwidth of the system by transmitting multiple data streams in parallel in the same frequency resources. A diversity receiver uses two or more antennas to improve the quality and reliability of a wireless link.

In the following, embodiments are described with reference to the drawings, wherein like reference numerals are generally utilized to refer to like elements throughout. In the following description, for purposes of explanation, numerous specific details are set forth in order to provide a thorough understanding of one or more aspects of embodiments. However, it may be evident to a person skilled in the art that one or more aspects of the embodiments may be practiced with a lesser degree of these specific details. The following description is therefore not to be taken in a limiting sense.

The various aspects summarized may be embodied in various forms. The following description shows by way of illustration various combinations and configurations in which the aspects may be practiced. It is understood that the described aspects and/or embodiments are merely examples, and that other aspects and/or embodiments may be utilized and structural and functional modifications may be made without departing from the scope of the present disclosure.

Figure 1B:
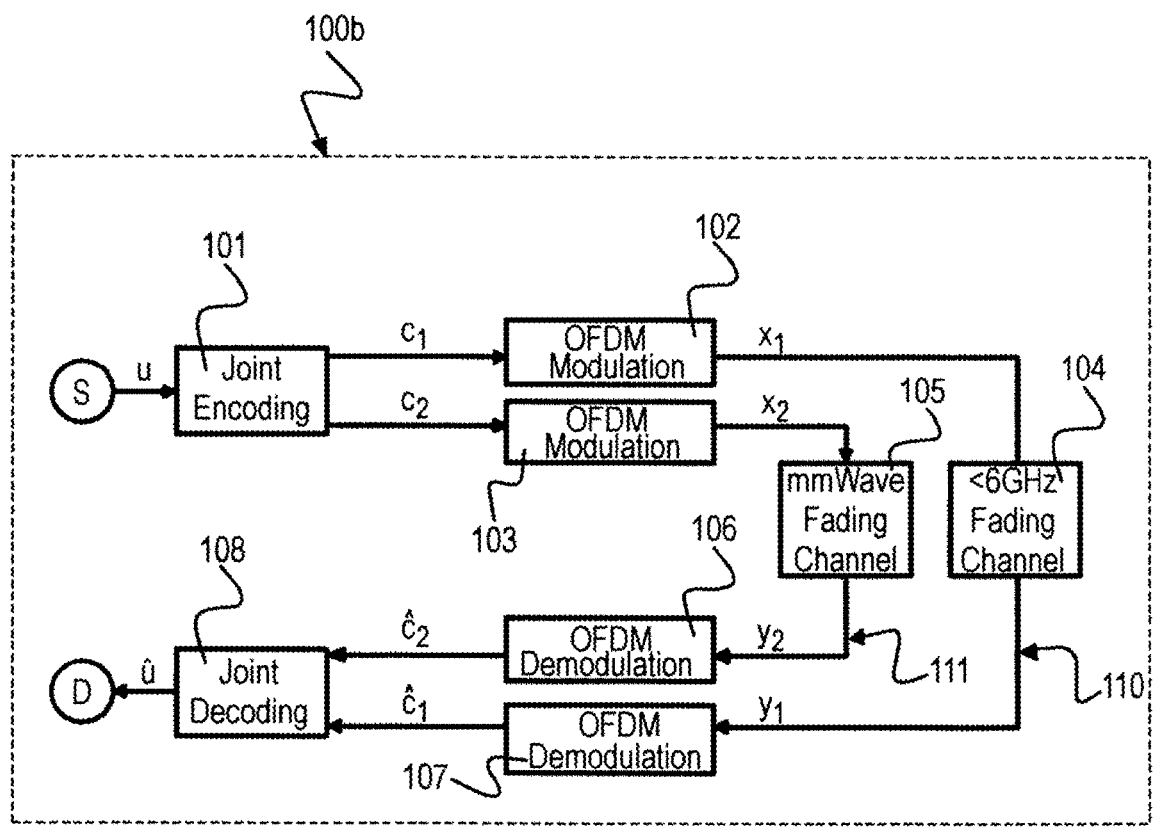
FIG. 1b is a block diagram illustrating a mobile communication system 100b using joint encoding across multiple Radio Access Technologies (RATs).

FIG. 1a is a system diagram illustrating a mobile communication system 100a including different Radio Access Technologies (RATs) 11, 12 for communication between a base station 10 and a mobile station 20. Methods and devices as described in the following sections may be implemented in the base station 10 and/or the mobile station 20. FIG. 1b is a block diagram illustrating a mobile communication system 100b using joint encoding across multiple Radio Access Technologies (RATs). Both RATs can be identical, for example the user may operate two WiFis simultaneously. Also, they can be different, e.g. LTE and WiFi may be operated simultaneously. A message u is transmitted from a source node S to a joint encoder 101 encoding the message u with a first subcode C1 and a second subcode C2. The message u coded with subcode C1 is transmitted by a first transmission path 110, the message u coded with subcode C2 is transmitted by a second transmission path 111. After transmission over the first transmission path 110, a first codeword $\hat{C}_1$ is received at a joint decoder 108 and after transmission over the second transmission path 111, a second codeword $\hat{C}_2$ is received at the joint decoder 108. The joint decoder 108 decodes both received codewords $\hat{C}_1$ and $\hat{C}_2$ and provides an estimate û of the original message u to a destination node D. The code comprising sub-codes may be a multi-edge LDPC code. Each sub-code may correspond to a different Edge-Type that has its specific node degree distribution. Due to different node degrees, each of the sub-codes may have different coding characteristics. Note that a "path" may correspond to independent radio standards which are operated jointly, such as LTE, WiFi, etc. Furthermore, a "path" may relate to an independent transmission stream, such as independent Spatial Streams in MIMO systems which are generated by a single system but exploit a multitude of independent spatial streams for transmission through spatial division multiplexing. In such a case, the data on each of the spatial streams can be encoded independently and thus the scheme introduced in this disclosure can be applied. Obviously, also a mixture of such spatial division multiplexing schemes with other systems, like other WiFi flavors, is of course possible.

The first transmission path 110 may be according to a first Radio Access Technology, e.g. including an OFDM modulator 102, a fading channel 104, for example smaller than 6 GHz and an OFDM demodulator 107. The second transmission path 111 may be according to a second Radio Access Technology, e.g. including an OFDM modulator 103, a fading channel 105, for example a millimeter wave fading channel and an OFDM demodulator 106. Strictly speaking mmWave bands start at 30 GHz. In the context of this disclosure, however, the term "mmWave spectrum" is used for bands above 6 GHz. Bands below 6 GHz are considered to be legacy wireless broadband bands.

The mobile communication system 100b includes a first transmission path 110, a second transmission path 111 and an encoder 101. The first transmission path 110 is configured to transmit a message u according to a first radio access technology 104. The second transmission path 111 is configured to transmit the message u according to a second radio access technology 105. The encoder 101 is configured to encode the message u by a code before transmission of the message u over the first transmission path 110 and the second transmission path 111. The code includes a plurality of subcodes c1, c2. The encoder 101 is configured to encode the message u intended for transmission over the first transmission path 110 with a first subcode c1 of the plurality of subcodes c1, c2 and to encode the message u intended for transmission over the second transmission path 111 with a second subcode c2 of the plurality of subcodes c1, c2.

The first radio access technology 104 may be a technology which employs LDPC coding, such as for example IEEE 802.11ac WiFi or 802.11n, etc. The second radio access technology 105 may be for example a millimeter wave radio access technology. Existing channel codes defined in the respective standards may be replaced by a joint multi-Edge LDPC code as mentioned above. For example, through a horizontal standard, existing codes can be replaced by multi-edge codes of identical coding rates, block size, etc. Then, the remaining part of the TX chain remains unchanged. In the RX chain a joint decoder may be implemented.

The code may include a multi-edge low density parity check (LDPC) code including a plurality of multi-edge LDPC subcodes. The first subcode c1 may include a first multi-edge LDPC subcode of the plurality of multi-edge LDPC subcodes. The second subcode c2 may include a second multi-edge LDPC subcode of the plurality of multi-edge LDPC subcodes. Each subcode may correspond to a different edge-type having a specific node degree distribution. A subcode corresponds to the sub-part of a Tanner-Graph of a given Edge Type (e.g., all connected "B" edges in FIG. 5a or similar). Alternatively, a subcode may correspond to a sub-part of the Tanner Graph of multiple Edge Type (e.g., all connected "B" and "R" edges in FIG. 5a or similar).

The first multi-edge LDPC subcode may be based on a signal to interference and noise characteristic of the first transmission path 110. The second multi-edge LDPC subcode may be based on a signal to interference and noise characteristic of the second transmission path 111. The first subcode and the second subcode may be optimized with respect to an observed multi-path propagation profile. The LDPC sub-code was derived such that it is beneficial characteristics for conveying messages over channels of certain characteristics, for example it may be optimized for a given multipath propagation profile, a certain SINR, etc. The corresponding optimization result typically leads to a certain node degree distribution (i.e., how many connection may arrive/depart from a given node).

The message u may include a plurality of data containers, also called "resource blocks" in an LTE specific notation. The first multi-edge LDPC subcode may be allocated to a first data container of the plurality of data containers and the second multi-edge LDPC subcode may be allocated to a second data container of the plurality of data containers. The term "resource block" as such is mainly used for LTE. Methods, systems and devices according to the disclosure, however, may apply to any other type of data container as well.

The allocation of the first multi-edge LDPC subcode to the first data container may be based on a signal-to-interference and noise ratio (SINR) of the first data container. The allocation of the second multi-edge LDPC subcode to the second data container may be based on a signal-to-interference and noise ratio (SINR) of the second data container. The first subcode and the second subcode may be optimized with respect to an observed multi-path propagation channel.

The first multi-edge LDPC subcode may be designed for allocation to a data container of the plurality of data containers on which an SINR is above a first SINR level. The second multi-edge LDPC subcode may be designed for allocation to a data container of the plurality of data containers on which an SINR is below a second SINR level.

In particular, a 5G wireless mobile communication system is considered in FIG. 1b in which multiple Radio Access Technologies (RATs) are operated simultaneously, for example 3GPP LTE (or its Evolution towards 5G) 104 and millimeter wave RATs 105. In this context it is assumed that a single code will be employed for the joint encoding 101 across multiple RATs as it is illustrated in FIG. 1b for the example of combining a millimeter wave and a <6 GHz RAT. It is understood that instead of these RATs depicted in FIG. 1b, other RATs may be used as well.

In the mobile communication system 100b, Multi-Edge Low-Density-Parity-Check (LDPC) Coding may be employed as described in the following since it allows to optimize sub-codes for distinct channels and to still keep the advantages of one overall code for joint encoding across all applicable RATs.

Typically, the presence of training sequences is known in advance. Therefore, in the following sections it is demonstrated how to parameterize the Multi-Edge LDPC code in order to optimally address Resource Blocks of different SINR. This is possible since a Multi-Edge LDPC code consists of multiple sub-Codes which can be optimized independently and thus they can be optimally mapped onto sequences of different SINR (one sub-Code being optimized for one given SINR level).

Figure 2:
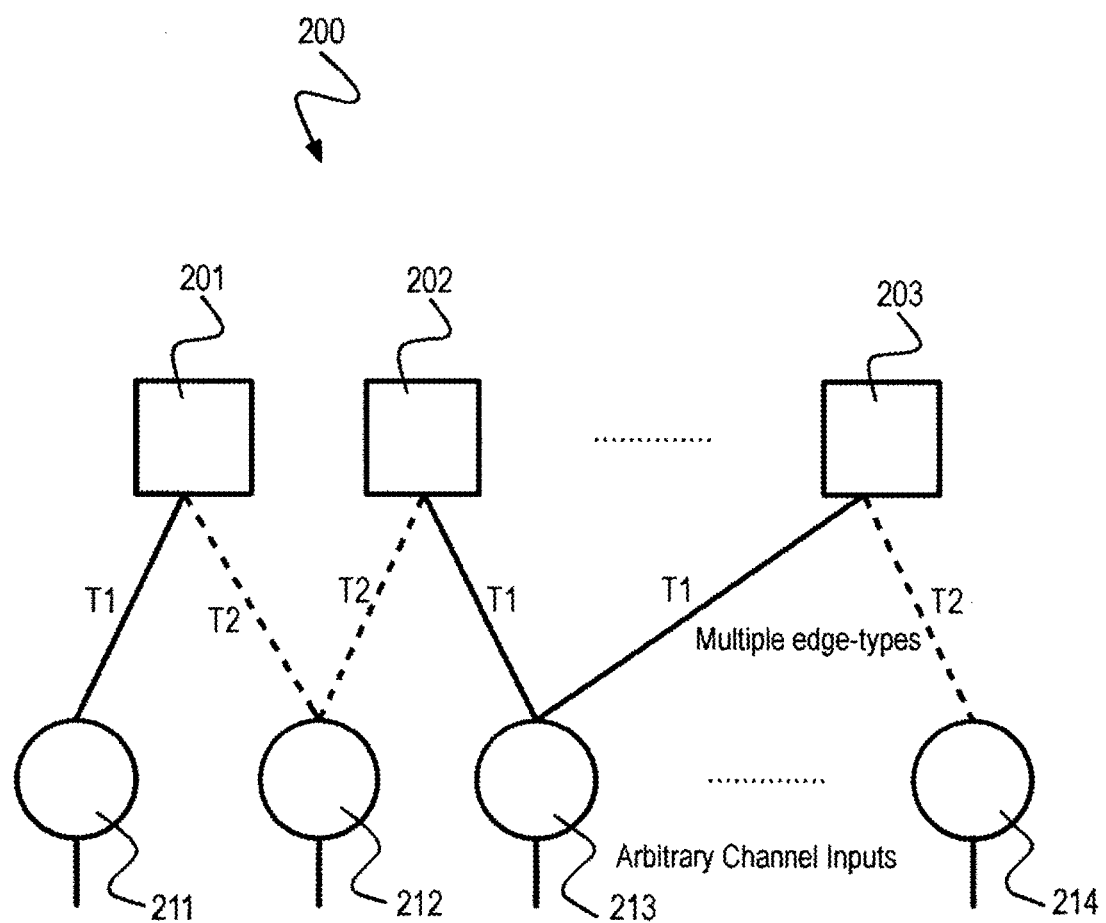
FIG. 2 is a schematic diagram illustrating Multi-Edge LDPC (Low Density Parity Check) coding 200.
Figure 5A:
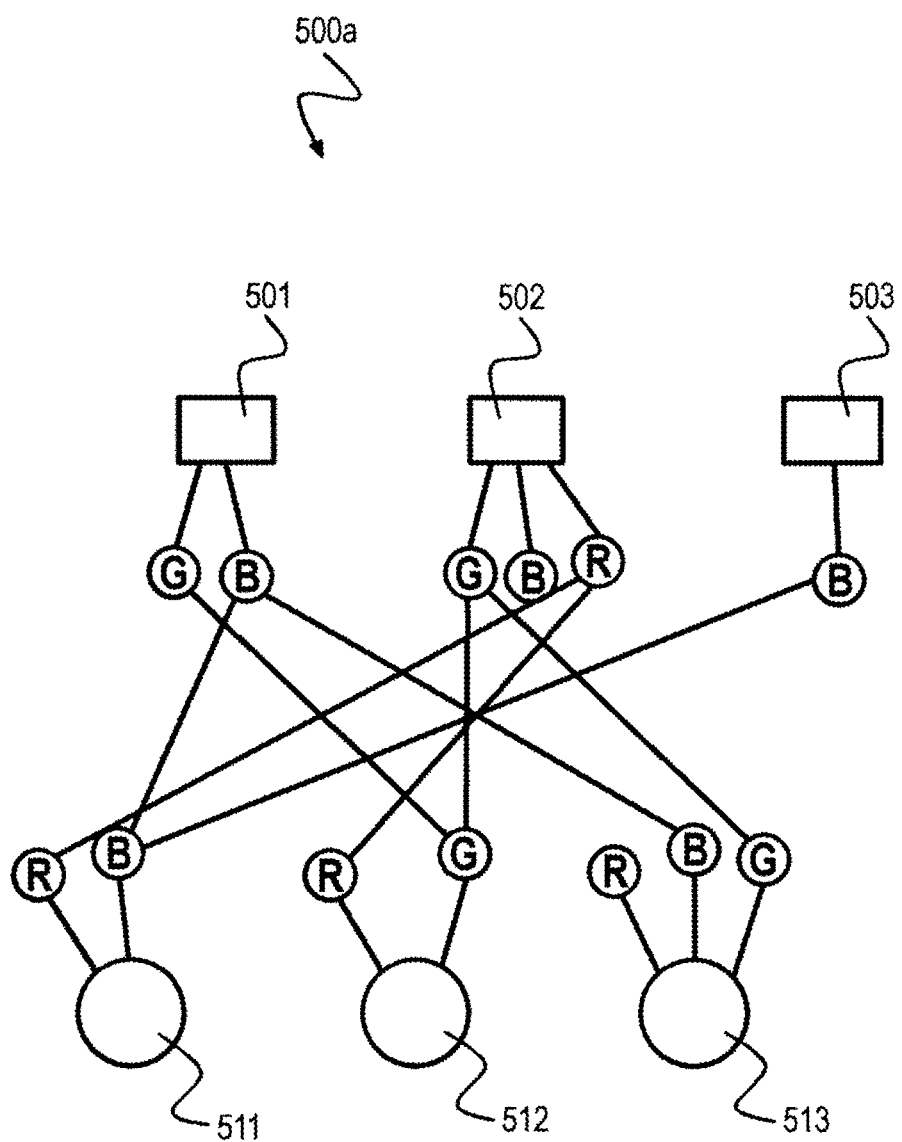
FIG. 5a is a schematic diagram illustrating an exemplary LDPC code 500a with various Edge Types (in this Example with Edge Types G, B and R).

The basic principle is to derive a "Multi-Edge Low Density Parity Check (LDPC)" Code comprising a multitude of "Edge-Types", e.g. according to the description of FIGS. 2 and 5a/b. For each of the edge-types a corresponding sub-Code structure may be identified which may be optimized for a different SINR level.

Resource Blocks of an LTE system may be identified in which interference is known to be introduced by neighboring cell(s), typically those resource blocks are training sequence blocks. The content of the LTE Resource Blocks of a given Serving Cell may be processed by a channel code which is corresponding to an optimum sub-Code of a Multi-Edge LDPC Code being optimized for the observed SINR level as described in the following sections.

The disclosure describes a solution to select an optimized Multi-Edge LDPC sub-code which is specifically optimized for the given SINR levels of a given Resource Block. By using such Multi-Edge LDPC sub-codes a substantial coding gain can be achieved compared to the state of the art solutions which apply an identical underlying code onto all Resource Blocks.

The parameterization of the Multi-Edge LDPC Code may be communicated through a standardized interface.

FIG. 2 is a schematic diagram illustrating Multi-Edge LDPC (Low Density Parity Check) coding 200. The Multi-Edge LDPC code 200 uses a plurality of check nodes 201, 202, 203 that are connected by multiple edge types T1, T2 to a plurality of variable nodes 211, 212, 213, 214 which may serve as arbitrary channel inputs.

Multi-Edge LDPC codes are a generalization of Single-Edge type LDPC codes. This generalization allows specifying more special LDPC codes than regular and irregular LDPC codes like repeat-accumulating, cyclic, and protograph based LDPC codes. The Multi-Edge framework introduces new constraints to specify the graph of LDPC codes. These Multi-Edge constrained graphs allow the design of single LDPC codes with highly different behavior for different parts of the codes, e.g. the sub-codes.

This is a key property of Multi-Edge LDPC codes. Those different parts can be exploited in order to optimize sub-codes (together with the overall code) for sub-channels with distinct channel gain properties. In the extreme case where each edge in the graph has a unique edge-type an individual LDPC code may be specified.

The following constraints are introduced by the framework: Multiple edge-types are introduced into the graph which enables the guidance of the interconnection between codeword bits and associated parity check equations; Each codeword bit can be assigned an arbitrary channel input. To specify punctured codeword bits the channel input value zero can be assigned.

Various performance aspects of LDPC codes like threshold performance, error floor levels and decoding complexity can be optimized through this framework. The threshold performance of Multi-Edge LDPC codes is assessable through Multi-Edge density evolution and through Multi-Edge EXIT (Extrinsic Information Transfer) analysis. Error floor levels may depend on the interconnection between codeword bits and associated parity check equations. Decoding complexity may be dependent on the number of interconnections per codeword bit/parity check equation.

The new approach according to the disclosure is structured as follows: A) Identification of SINR levels across LTE Resource Blocks of a Serving Cell; B) Allocation of suitable Multi-Edge LDPC Sub-Codes to various Resource Blocks depending on SINR levels; and C) Encoding of data and transmission.

With respect to Identification of SINR levels across LTE Resource Blocks of a Serving Cell, a Multi-Edge LDPC matrix may be derived which is providing a multitude of "Edges Types", each of which is leading a sub-LDPC Code that is optimized for a given SINR level and channel profile. For this reason, a step function may be derived representing a statistical distribution of the channel gains of a given RAT in a quantized representation. The basic principle is indicated in FIGS. 3 and 4 below.

Figure 3:
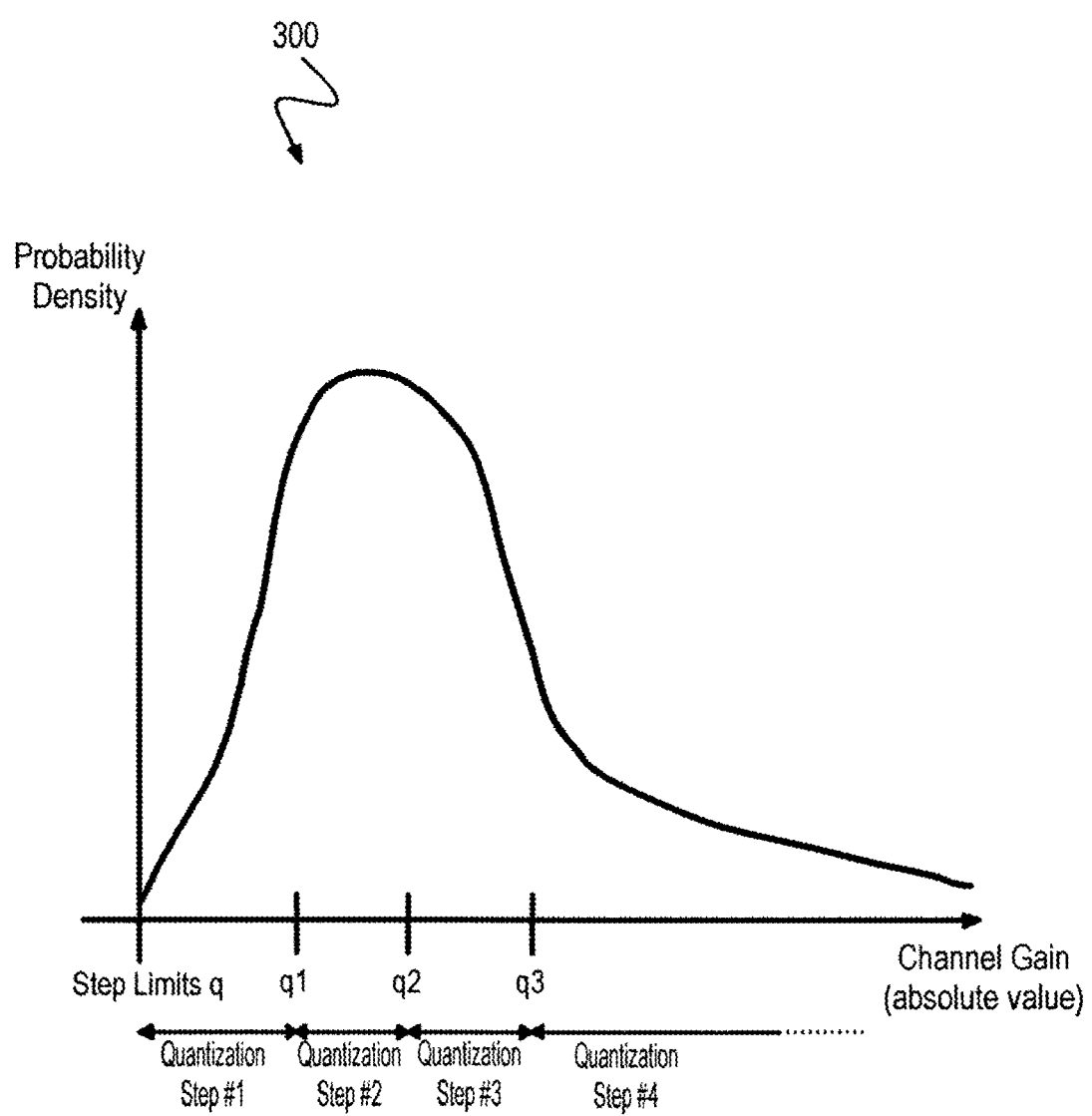
FIG. 3 is a graph 300 illustrating an exemplary probability density function over channel gains.

FIG. 3 is a graph 300 illustrating an exemplary probability density function over channel gains. The probability density function represents the probability density for different quantization steps #1, #2, #3 and #4 related to the step limits q1, q2, q3 etc. as depicted in FIG. 3.

Figure 4:
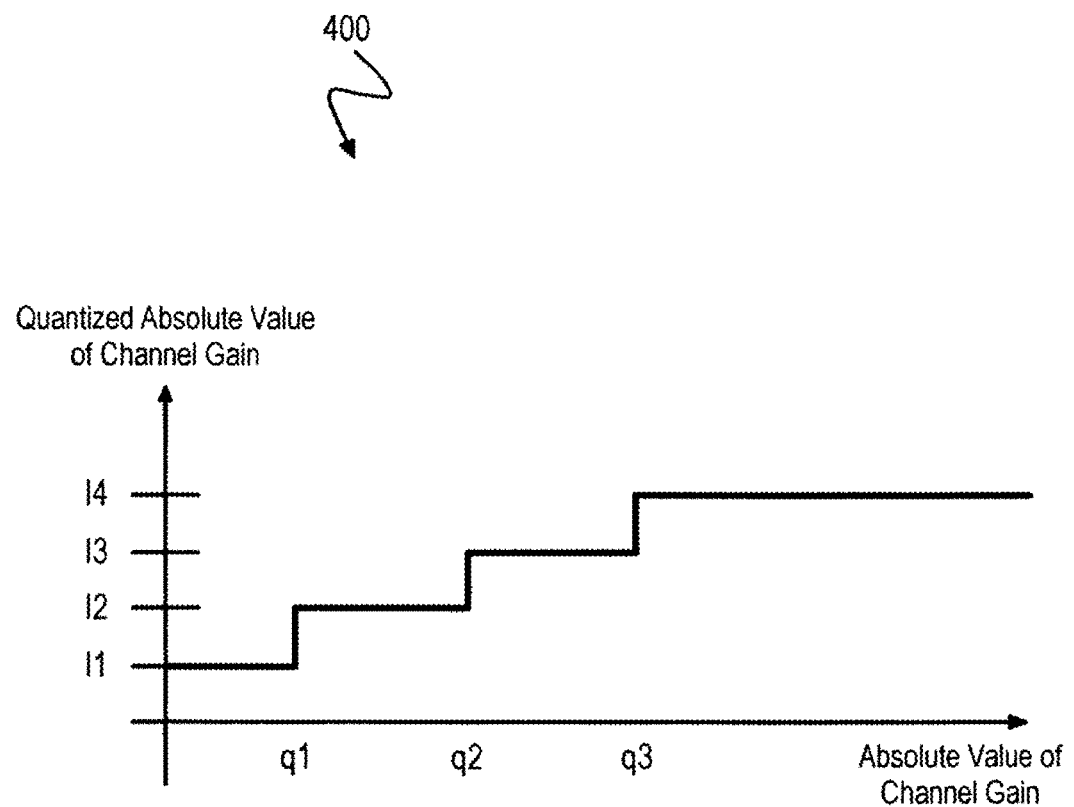
FIG. 4 is a graph 400 illustrating an exemplary quantized representation of channel gains.

FIG. 4 is a graph 400 illustrating an exemplary quantized representation of channel gains. The quantized absolute value of channel gains q1, q2, q3 etc. can be represented as a step function as depicted in FIG. 4.

FIG. 5a is a schematic diagram illustrating an exemplary LDPC code 500a with various Edge Types (in this Example with Edge Types G, B and R).

The Multi-Edge LDPC code 500a uses a plurality of check nodes 501, 502, 503 that are connected by multiple edge types G (edge type green), B (edge type blue) and R (edge type red) to a plurality of variable nodes 511, 512, 513 which may serve as arbitrary channel inputs. Only a specific edge type is connected to a corresponding edge type, i.e. edge type G is connected to edge type G, edge type B is connected to edge type B and edge type R is connected to edge type R.

The illustration shows how multiple Edges are managed in the context of a Multi-Edge LDPC code such that each corresponding sub-Code can be optimized for a different quantized channel gain.

Figure 5B:
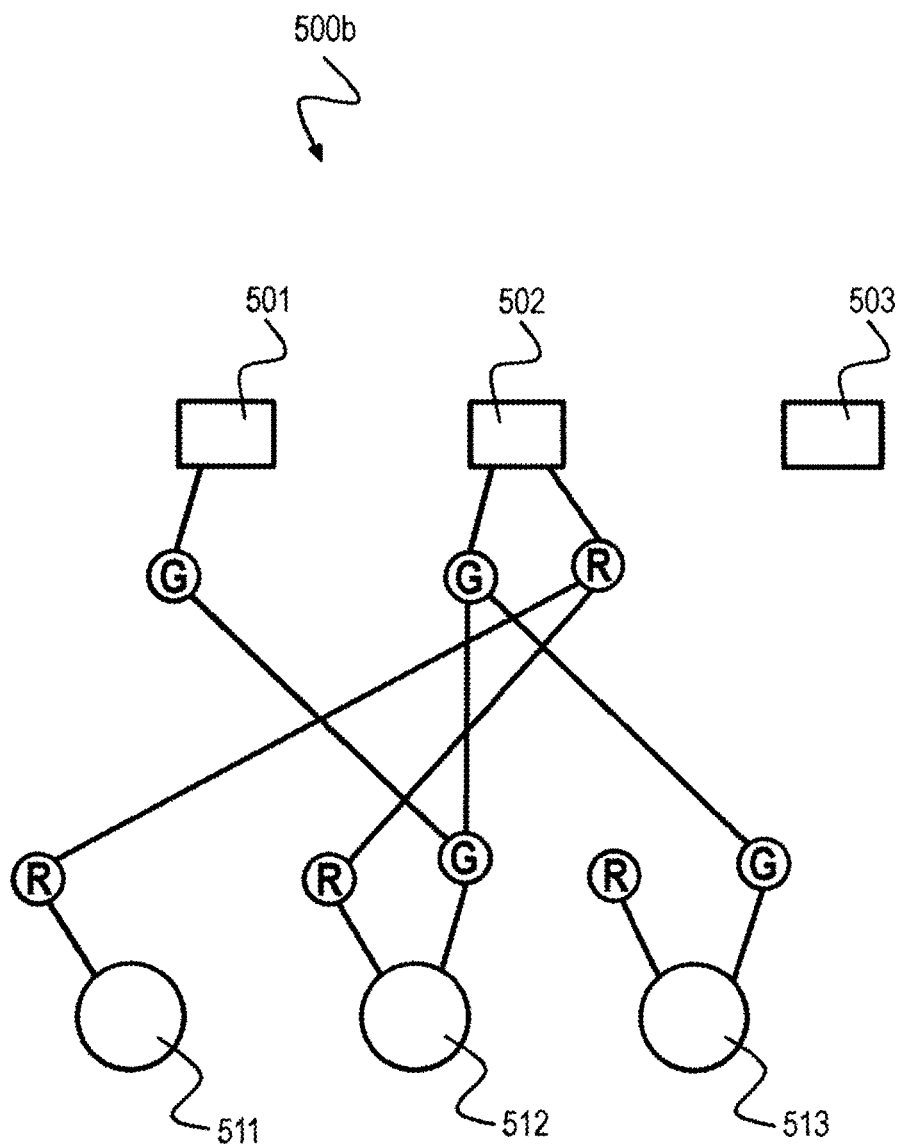
FIG. 5b is a schematic diagram illustrating an exemplary LDPC code 500b with various Edge Types (in this Example with Edge Types G and R).

FIG. 5b is a schematic diagram illustrating an exemplary LDPC code 500b with various Edge Types (in this Example with Edge Types G and R).

The Multi-Edge LDPC code 500b correspond to the Multi-Edge LDPC code 500a from which the edge types B are removed. I.e., edge type G is connected to edge type G and edge type R is connected to edge type R.

The multi-edge type framework has two novel properties which are distinguishable edges and sockets and variable nodes associated with different channel outputs. These properties may be used to design LDPC codes optimized for multiple channel inputs. The socket concept of the single-edge type setting is extended in the multi-edge type framework. Every multi-edge type socket is linked to an edge type. The multi-edge type edge interleaver is constrained to only connect sockets of the same edge type. An example of the multi-edge type edge interleaver and the association of variable nodes to different channel inputs is shown in the FIGS. 5a and 5b. The two socket types are differentiated by colors Green (G), Blue (B) and red (R) in FIG. 5a and by colors Green (G), and red (R) in FIG. 5b.

For single-edge type degree distributions, scalar values suffice to denote the degree of a node. In contrast, for multi-edge type degree distributions a degree type vector is needed. Similar to single-edge type degree distributions, the degree values are denoted as exponents. The degree type vector $dc=(d(1); \ldots ; d(T))$ for check nodes has T integer entries. The ith value in the vector represents the number of edges or sockets of the ith edge type.

In the following, the model described above is applied to a LTE scenario in which neighboring cell(s) create(s) interference onto a serving cell as it is illustrated in the sequel.

Figure 6:
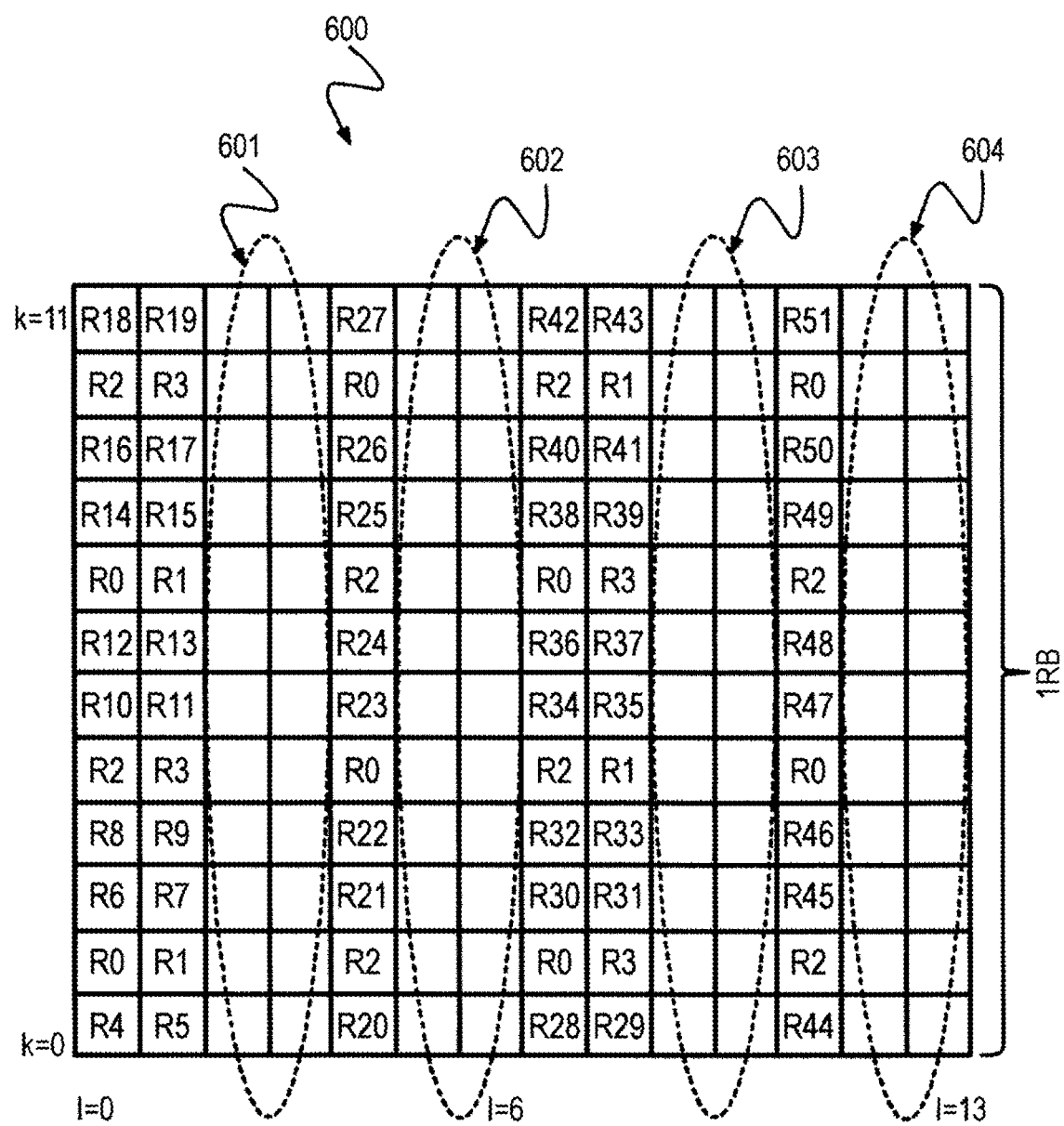
FIG. 6 is a schematic diagram illustrating an exemplary Multi-Edge LDPC sub-Code mapping 600 onto Resource Blocks not undergoing interference from neighboring cells.

FIG. 6 is a schematic diagram illustrating an exemplary Multi-Edge LDPC sub-Code mapping 600 onto Resource Blocks not undergoing interference from neighboring cells. FIG. 6 represents a resource block in a time/frequency representation where l=0, l=6 and l=13 specifies the time or subframe index while k=0 and k=11 specifies the frequency index.

Reference signals of the serving cell are denoted by R0, R1, R2 and R3 while cell-specific reference signals CRS with individual offsets, colliding and non-colliding with serving cell CRS are represented by R4, R5, R6, ..., R51. Interference is always present regardless of network load.

FIG. 6 shows allocation of resource blocks 601, 602, 603, 604 to those Multi-Edge LDPC sub-codes which have been optimized for high SINR levels (since no interference is expected from neighboring cells). The selection of LDPC sub-codes also takes the channel gain onto the various resource blocks into account.

Figure 7:
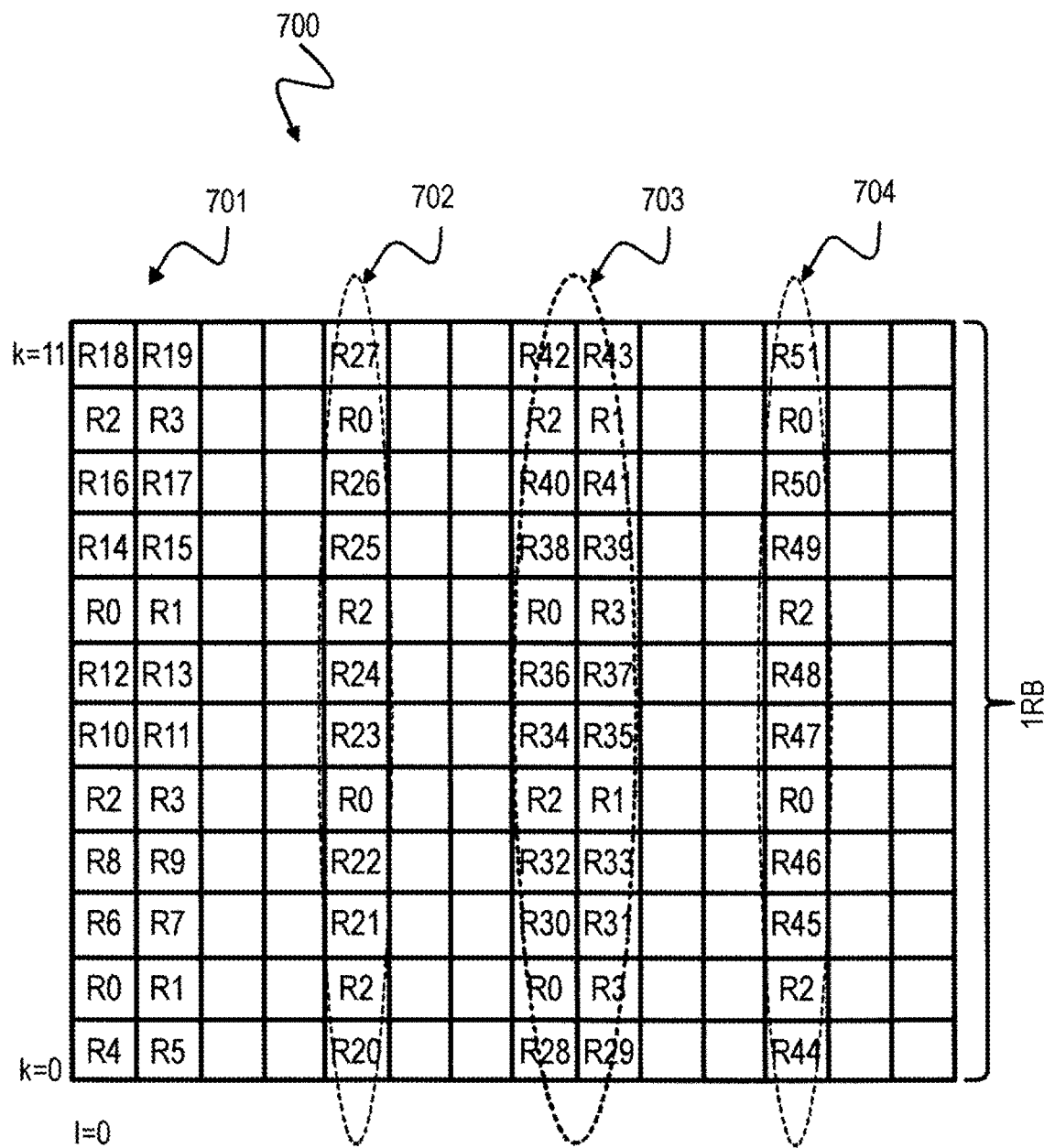
FIG. 7 is a schematic diagram illustrating an exemplary Multi-Edge LDPC sub-Code mapping 700 onto Resource Blocks undergoing interference from neighboring cells.

FIG. 7 is a schematic diagram illustrating an exemplary Multi-Edge LDPC sub-Code mapping 700 onto Resource Blocks undergoing interference from neighboring cells. FIG. 7 represents a resource block in a time/frequency representation where l=0, l=6 and l=13 specifies the time or subframe index while k=0 and k=11 specifies the frequency index.

Reference signals of the serving cell are denoted by R0, R1, R2 and R3 while cell-specific reference signals CRS with individual offsets, colliding and non-colliding with serving cell CRS are represented by R4, R5, R6, ..., R51 according to the representation of FIG. 6.

FIG. 7 shows allocation of resource blocks 701, 702, 703, 704 to those Multi-Edge LDPC sub-codes which have been optimized for low SINR levels (since interference is expected from neighboring cells). The selection of LDPC sub-codes also takes the channel gain onto the various resource blocks into account.

As described above, the new approach according to the disclosure is structured as follows: A) Identification of SINR levels across LTE Resource Blocks of a Serving Cell; B) Allocation of suitable Multi-Edge LDPC Sub-Codes to various Resource Blocks depending on SINR levels; and C) Encoding of data and transmission.

With respect to the first step A), knowledge may be identified that is available on Interference levels (created by Neighboring Cells) onto the Resource Blocks of the Serving Cell in future transmissions. This is typically knowledge on Reference Signals to be transmitted by Interfering Cells in the future on specific Resource Blocks. In some cases, it may also be knowledge on the usage (or non-usage) of Resource Blocks to be used for data transmission in the future by interfering cells. For example, statistical models (such as Bayesian prediction) can be exploited in order to predict the future allocation of data symbols to Resource Blocks in Neighboring Cells. Direct interactions between a Serving Cell and Neighboring Cells may be applied as well, i.e. the information on future allocation of data to Resource Blocks may be directly communicated by a Neighboring Cell to a Serving Cell. The latter case may in particular be applicable to Cloud-RAN types of networks where all signal processing of multiple (all) Base Stations is performed in a single server farm.

With respect to the second step B), the fact can be exploited that there is a 1:1 relationship between the quantized channel gains illustrated above at modified SINR levels. Actually, a higher channel attenuation finally just leads to an decreased SINR level (since the signal level is lower while the Interference and Noise levels typically are assumed to be constant over the entire spectrum); a lower channel attenuation finally leads to an increased SINR level (since the signal level is higher while the Interference and Noise levels typically are assumed to be constant over the entire spectrum). So, when the channel gain does not change but the Interference levels vary, the resulting configuration can be directly mapped to the case in which the channel gain varies and the Interference level stays constant (an increase/decrease of the interference level of "x dB" corresponds to an increase/decrease of the channel attenuation by the same "x dB" with the interference plus noise levels being assumed to be constant). With this observation, the suitable sub-Code of the given Multi-Edge LDPC Code may be allocated to each of the Resource Blocks, i.e. a sub-Code being optimized for high SINR levels may be allocated to those Resource Blocks where no interference is expected from neighboring cells and a sub-Code being optimized for low SINR levels may be allocated to those Resource Blocks where interference is expected from neighboring cells.

Then, the third step C) can be applied, i.e. encoding of data and transmission. The user data may be encoded by the LDPC according to the mapping identified above, e.g. as it is illustrated in the examples of FIG. 6 and FIG. 7. The applied encoding selection may be communicated to the receiver through proper signaling.

Figure 8A:
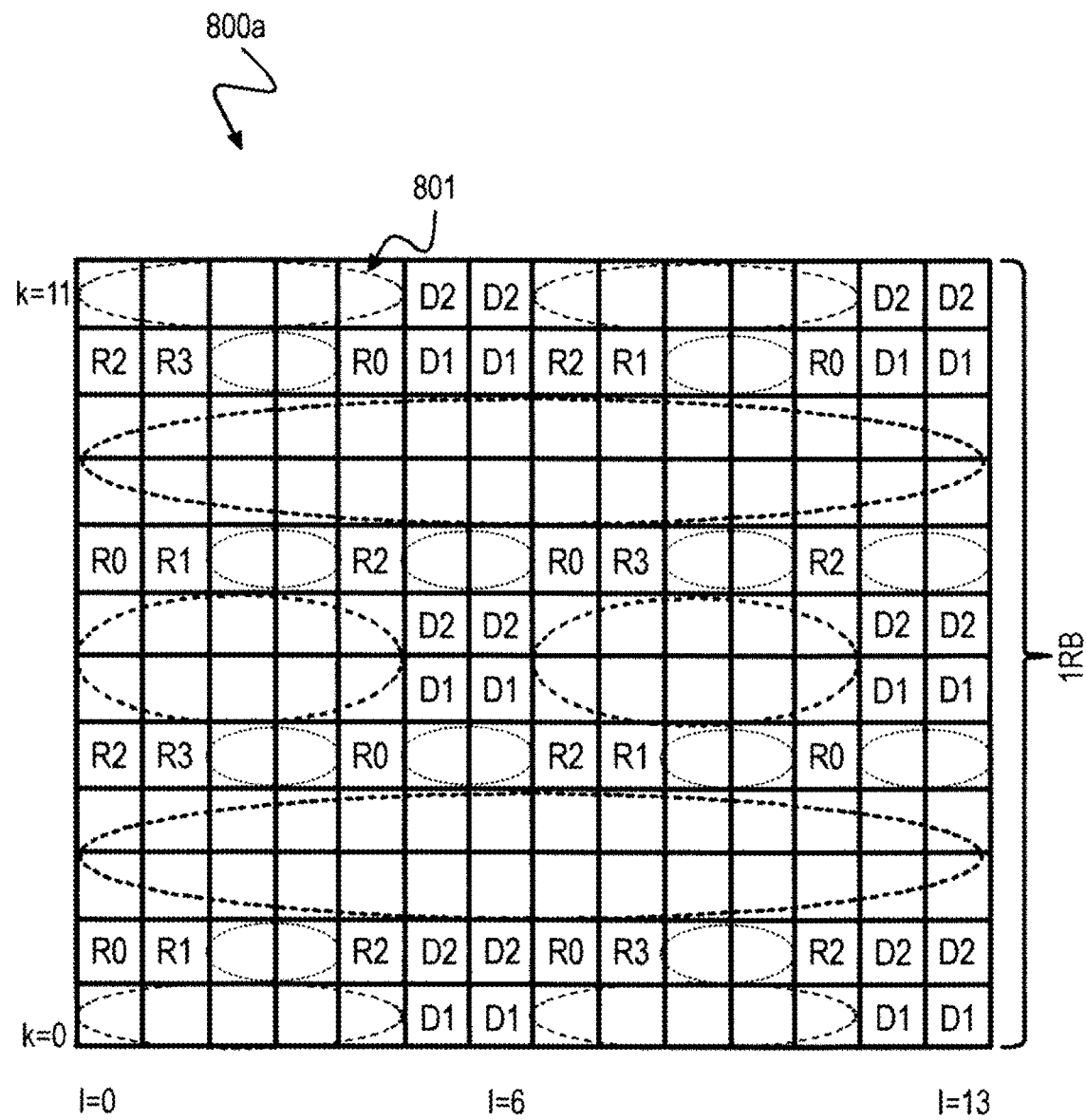
FIG. 8a is a schematic diagram illustrating allocation of resource blocks 800a for a MIMO Reference Signal scenario.
Figure 8B:
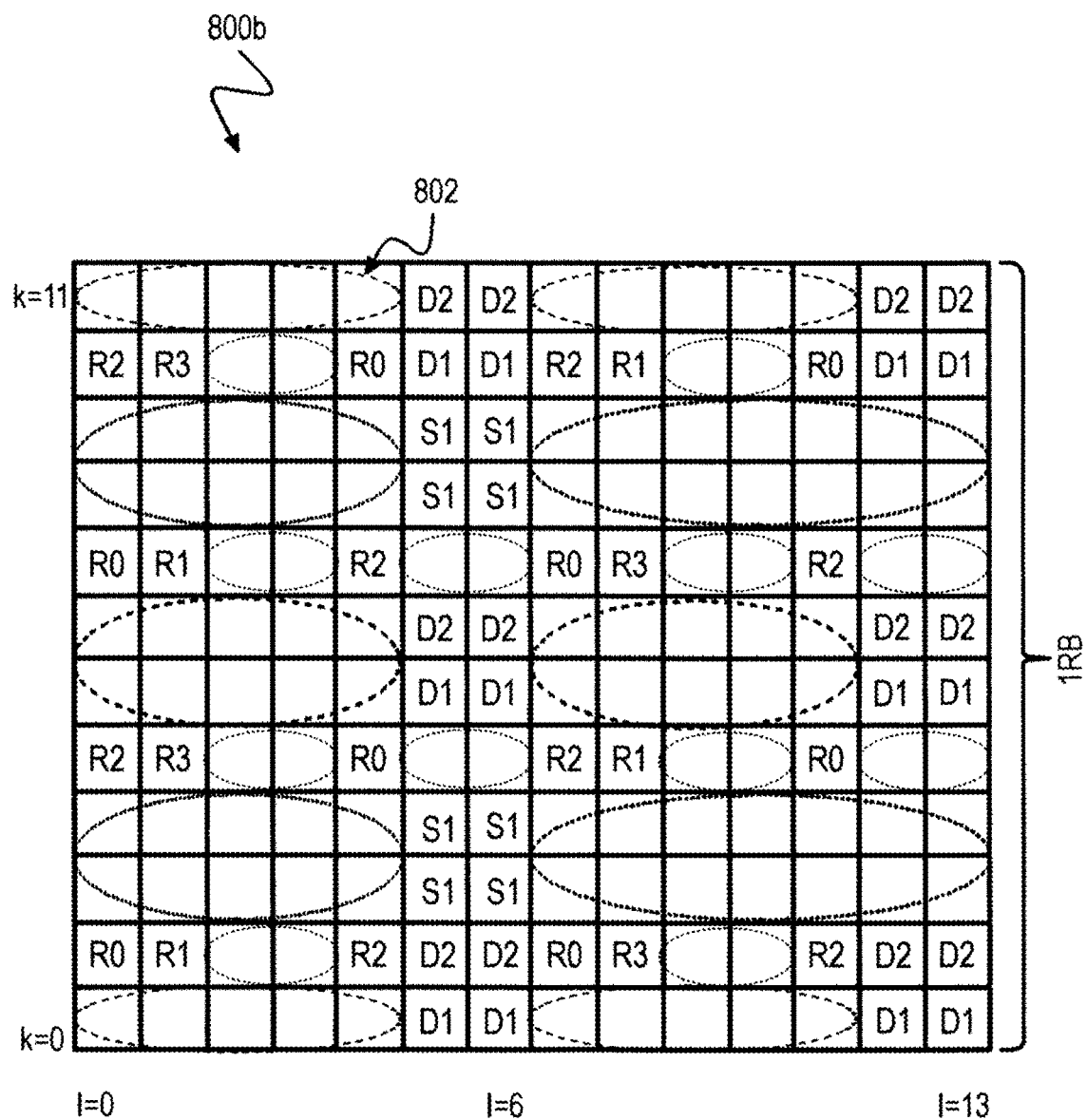
FIG. 8b is a schematic diagram illustrating allocation of resource blocks 800b for a MIMO Reference Signal scenario with Channel State Information (CSI) Reference Signals.

For the MIMO case, the usage of different Multi-Edge LDPC sub-codes and their allocation to Resource Blocks is illustrated in FIGS. 8*a* and 8*b*.

FIG. 8*a* is a schematic diagram illustrating allocation of resource blocks 800*a* for a MIMO Reference Signal scenario.

FIG. 8*a* represents a resource block in a time/frequency representation where l=0, l=6 and l=13 specifies the time or subframe index while k=0 and k=11 specifies the frequency index for a MIMO scenario.

Reference signals of the serving cell are denoted by R0, R1, R2 and R3 while UE-specific demodulation reference signals DMRS are represented by D1 and D2. UE-specific demodulation reference signals (DMRS) allow for example up to 8 layer multi-user MIMO transmission. No explicit precoding signaling is required, as DMRS undergo the same precoding as the data.

Resource blocks 801 may be allocated to those multi-edge LDPC sub-codes which have been optimized for high SINR levels (since no interference is expected from neighboring cells). The selection of LDPC sub-codes may also take the channel gain onto the various resource blocks into account.

FIG. 8*b* is a schematic diagram illustrating allocation of resource blocks 800*b* for a MIMO Reference Signal scenario with Channel State Information (CSI) Reference Signals.

FIG. 8*b* represents a resource block in a time/frequency representation where l=0, l=6 and l=13 specifies the time or subframe index while k=0 and k=11 specifies the frequency index for a MIMO scenario with channel state information reference signals.

Reference signals of the serving cell are denoted by R0, R1, R2 and R3 while UE-specific demodulation reference signals DMRS are represented by D1 and D2 according to the representation of FIG. 8*a*. Sporadic subframes with channel state information reference signals (CSI-RS) allow channel state feedback calculation for eNB link adaptation.

Resource blocks 802 may be allocated to those multi-edge LDPC sub-codes which have been optimized for low SINR levels (since interference is expected from neighboring cells). The selection of LDPC sub-codes may also take the channel gain onto the various resource blocks into account.

Another application for allocation of multi-edge LDPC sub-codes is in HetNets where the Pico Cell receives the Macro Cell signals but not vice versa. The Pico cell may estimate the interference for future TTIs and allocate Multi-Edge LDPC Sub-Codes according to these estimates (i.e. Resource blocks allocated to Multi-Edge LDPC Sub-Codes optimized for high SINR levels when Interference from Macro Cell is high and Resource blocks allocated to Multi-Edge LDPC Sub-Codes optimized for low SINR levels when Interference from Macro Cell is low).

Another application for allocation of multi-edge LDPC sub-codes is in Almost Blank Subframes (ABS) for enhanced ICIC (eICIC) where the ABS for the Macro Cell are transmitted with a semi static pattern and the pattern is known at the small cells within the range of the Macro Cell. The small cell allocates Resource Blocks to a UE at the small cell edge and encodes them with Multi-Edge LDPC Sub-Codes optimized for the SINR levels corresponding to whether the Macro inserts ABS at these positions in the radio frame and Interference is low or no ABS is inserted and Interference is high.

The new approach according to the disclosure may described as follows: Identification of different SINR levels on LTE Resource Blocks (due to interference from neighbouring cells, the SINR levels may be reduced) and allocation of suitable Multi-Edge LDPC sub-codes to LTE Resource blocks of suitable SINR. I.e., each Multi-Edge LDPC sub-code has been optimized for a given SINR level and the suitably optimized sub-code is mapped to those Resource Blocks on which the target SINR level is observed. For UL, Mobile Device may be informed by BS about the suitable Multi-Edge LDPC sub-code to be used for the various Resource Blocks. The Mobile Device may apply the indicated Multi-Edge LDPC subcode such that the data is suitably encoded for the target Resource Blocks.

Figure 9:
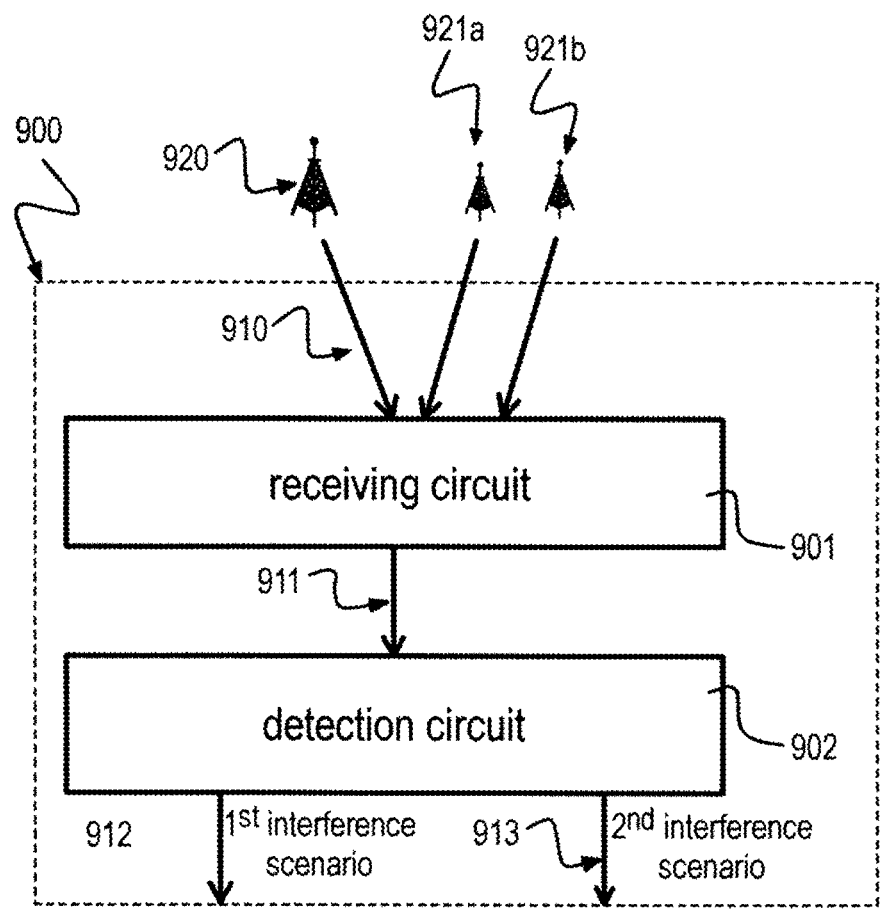
FIG. 9 is a block diagram illustrating a mobile receiver 900 detecting multiple interference scenarios by decoding with multiple subcodes.

FIG. 9 is a block diagram illustrating a mobile receiver 900 detecting multiple interference scenarios by decoding with multiple subcodes.

The mobile receiver 900 includes a receiving circuit 901 and a detection circuit 902. The receiving circuit 901 is configured to receive a signal 911 comprising transmissions 910 from a serving radio cell 920 and a plurality of interfering radio cells 921*a*, 921*b*, wherein the signal (911) is encoded by a code comprising a plurality of subcodes. The detection circuit 902 is configured to detect a first interference scenario 912 based on decoding the signal 911 with a first subcode of the plurality of subcodes and to detect a second interference scenario 913 based on decoding the signal 911 with a second subcode of the plurality of subcodes.

The receiving circuit 901 may be configured to receive the signal 911 including a plurality of resource blocks, wherein a particular subcode of the plurality of subcodes may be allocated to a respective resource block of the plurality of resource blocks. The particular subcode allocated to the respective resource block may depend on a channel gain of the respective resource block.

The first subcode may be adapted or optimized for the first interference scenario 912 and the second subcode may be adapted or optimized for the second interference scenario 913.

The code may include a multi-edge low density parity check (LDPC) code including a plurality of multi-edge LDPC subcodes as described above with respect to FIGS. 1 to 8.

Figure 10:
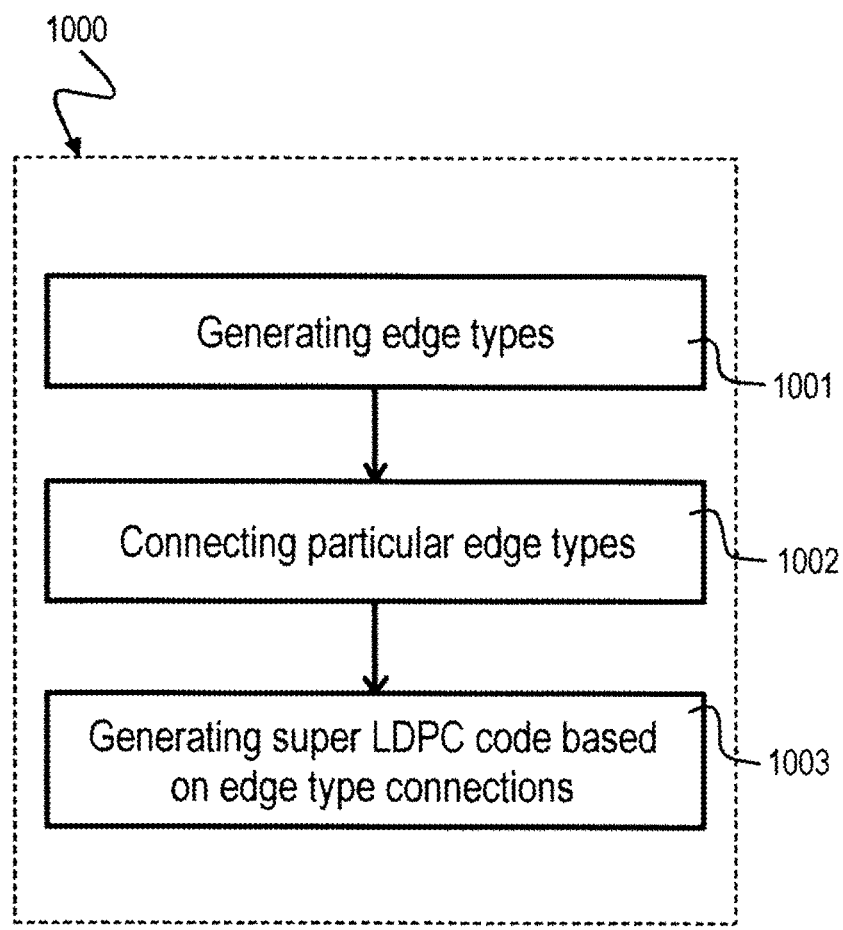
FIG. 10 schematically illustrates an exemplary method 1000 for generating a super LDPC code.

FIG. 10 schematically illustrates an exemplary method 1000 for generating a super LDPC code.

For a given combination of RATs and the given characteristics (in particular frequency domain channel gain profile) of the over-the-air propagation channels for each RAT, a different optimum Multi-Edge LDPC Code needs to be found. The disclosed method 1000 is a solution to the problem on how to assembly a (near) optimum code in an efficient and low-complexity way while relying on pre-calculated structures (allowing a highly efficient hardware implementation).

The basic principle is to derive a "Multi-Edge Low Density Parity Check (LDPC)" Code comprising a multitude of "Edges" (possibly tens of edges or even hundreds of edges or more). For each of the edges a corresponding sub-Code is identified. For given set of RATs and a given observation of the over-the-air propagation channel characteristics, the most suitable sub-Codes out of the original "super LDPC matrix" are extracted and assembled into a new LDPC matrix which is finally used for the encoding/decoding approach.

Known solutions typically rely on independently derived codes for each of the concerned RATs. The disadvantage is that the application of independent codes do not allow for an exploitation of coding diversity across multiple RATs. The solution according to the method 1000 as described in the following allows to have an easy, low-complex and straight forward selection of sub-codes from a "super LDPC matrix" and to assemble a new code (comprised of the selected sub-codes) which additionally allows for an exploitation of code diversity across the concerned RATs.

The method 1000 may be used for generating a super low density parity check (LDPC) code based on an LDPC code including a first set of variable nodes and a second set of check nodes. The wording "super" relates to the fact that a large number of different sub-codes are integrated into a single large matrix.

The method 1000 includes generating 1001 a plurality of edge types for the first set of variable nodes and the second set of check nodes, each edge type depending on a particular radio access technology of a set of radio access technologies and a channel profile of the particular radio access technology. The method 1000 includes connecting 1002 a particular edge type of the variable nodes with a corresponding edge type of the check nodes according to a particular subcode of the LDPC code. The method 1000 includes generating 1003 the super low density parity check (LDPC) code based on the edge type connections of the plurality of edge types.

The particular subcode of the LDPC code may be optimized for the particular radio access technology and the channel profile of the particular radio access technology.

The method 1000 may include: generating the channel profile of the particular radio access technology as a step function representing a statistical distribution of channel gains of the particular radio access technology in a quantized representation.

The method 1000 may include: identifying the set of radio access technologies based on radio access technologies that can be combined in a transmitter/receiver pair and based on a required link characteristic of the transmitter/receiver pair.

The LDPC code may include a multi-edge LDPC code including a plurality of multi-edge LDPC subcodes, e.g. as described above with respect to FIGS. 1 to 8. A user may operate "N" different RATs simultaneously (or (partly) sequentially) and multi-Edge LDPC coding is used for a subset of "K<N" of those RATs. The other RATs may use other channel coding schemes which are defined in the respective standards. In one implementation form existing coding schemes (for example Turbo Code defined in LTE, legacy LDPC codes in IEEE 802.11n WiFi, etc.) may be implemented by multi-Edge LDPC codes in order to achieve an improved system performance in the context of a multi-RAT context. Such an approach can for example be achieved through a "horizontal" standard which defines that the existing coding schemes need to be replaced. In such a case, the code rate (and block size, etc.) of the corresponding multi-edge LDPC sub-codes must exactly correspond to the code rate (and block size, etc.) of the channel codes defined in the original standard such that the remaining part of the transmission chain is untouched. In the receiver, a joint channel decoder must then be implemented decoding all multi-Edge encoded data streams over all RATs. This finally leads to an improved system performance due to the exploitation of synergies across multiple RATs. This approach of replacing existing channel coding schemes by another "joint" scheme across multiple RATs can of course be applied to other channel codes (other than multi-edge LDPC codes) such as a joint convolutional code, joint single-edge LDPC code, joint Turbo Code, joint Block Code, etc.

The method 1000 may include: generating 1003 the super low density parity check (LDPC) code as a matrix comprising all edge type connections of the plurality of edge types.

In the following, a presentation for generating a super LDPC matrix is given. The presentation of the new approach is structured as follows: i) Derivation of a "super LDPC matrix" comprising a multitude of "Edge-Types" (possibly tens of "edge-types" or even hundreds of "edge-types" or more) optimized for a large set of different RATs and their over-the-air propagation channel characteristics. ii) Selection of the suitable combination of RATs in the transmitter and observation of over-the-air propagation channel characteristics. iii) Selection of the suitable sub-codes (i.e., related to a given "Edge-Type" in the LDPC code) and combination of the identified sub-codes into a new joint LDPC Code Matrix. Derivation of a "super LDPC matrix" comprising a multitude of "Edges" (possibly tens of edges or even hundreds of edges or more) optimized for a large set of different RATs and their over-the-air propagation channel characteristics.

The "super LDPC matrix" is providing a multitude of "Edges Types", each of which is leading a sub-LDPC Code that is optimized for a given RAT and a given over-the-air channel profile. For this reason, a step function may be derived representing a statistical distribution of the channel gains of a given RAT in a quantized representation.

For each RAT and each quantized channel gain level illustrated above with respect to FIGS. 3 and 4, a distinct Edge Type may be introduced into the LDPC optimization process. The code may then be derived in the following steps: 1. Derive an (optimum) ensemble of Edge Type degree distribution for Variable nodes and Check nodes of the LDPC Code, 2. Derive a suitable Code meeting the Edge Type degree distribution requirements derived in item 1.

Based on the available RATs that can be combined in a given transmitter/receiver pair (or ensemble of (multiple) transmitter(s) and (multiple) receiver(s)) and based on the required link characteristics (such as system latency, aggregate throughput, BER/PER requirements, subscription cost requirements, or a combination of such requirements, etc.) an ensemble of RATs to be operated simultaneously may be identified. In a typical example, LTE is jointly operated in combination with WiFi, or LTE is jointly operated in combination with WiGig, etc. Once the combination of RATS is selected, the propagation channel is observed, e.g. through channel impulse response measurements (possibly through feedback by the receiver, or through exploitation of reciprocity of transmission/reception paths, etc.) or similar.

In step i) above, as illustrated in FIG. 4, for each RAT a set of sub-Codes may be defined each corresponding to a given propagation channel quantization level. For the observed actual over-the-air propagation channel, the most suitable quantization levels to be considered may be derived (among the pre-defined ensemble—it may be defined as illustrated in FIG. 4 for a given example).

Once the set of most suitable quantization levels for a given over-the-air propagation channel is identified, the corresponding sub-Codes may be identified (this is pre-defined and typically only requires to check a look-up table, i.e. typically when the super LDPC matrix is provided, there is information given which sub-Code (and thus which Edge-Type) is related to which RAT and which channel quantization level).

Once the suitable sub-Codes (and thus applicable Edge-Types) are identified, those may be subtracted from the super LDPC Matrix and aggregated into a new LDPC encoding matrix. Suitable sub-Codes may be identified by matching Edge-Type degree to the required link characteristics (such as system latency, aggregate throughput, BER/PER requirements, subscription cost requirements, or a combination of such requirements, etc.) by either 1. Analytical information: high SNR link usually corresponds to large Edge-Type degrees or 2. Empirical information: testing each sub-Code with each link characteristic and measuring its performance (e.g. BER, FER, Coding Gain etc). The super LDPC Matrix encodes the Edge-Type corresponding to each edge (e.g. 1 for Edge-Type-1, 2 for Edge-Type-2 etc.). The reduced LDPC Matrix may be derived by either 1. Copying the super LDPC Matrix and deleting all Edge-Types of non-suitable sub-codes or 2. Copying all suitable Edge-Types into an empty (e.g. all-zero) LDPC matrix of the same size. From the reduced LDPC Matrix any hardware/software implementation for encoding/decoding can be derived.

Assuming that the super LDPC Matrix corresponding to the graph given in FIG. 5 is used, and assuming that only sub-Codes corresponding to Edge Types 1 and 3 will be kept, the final LDPC matrix will correspond to the graph depicted in FIG. 5b.

An exemplary method for generating a super LDPC code may be defined as follows: Generation of a large "super" Multi-Edge LDPC code comprising a multitude of distinct sub-codes, each of which is optimized for a different SINR level and corresponding propagation channel characteristics. Identification of required SINR levels for Multi-Edge LDPC subcodes (typically by evaluating channel gain and noise characteristics in the receiver). Selection of suitable Multi-Edge LDPC subcodes which are available in the "super" Multi-Edge LDPC code. Extraction of the identified Multi-Edge LDPC sub-codes into a new LDPC matrix to be applied for channel coding. In the transmitter (either Mobile Device or Base Station), the resulting Multi-Edge LDPC Matrix is used for channel coding. The coded bits are finally mapped onto those Resource Blocks/Carriers whose characteristics (noise/propagation channel characteristics) correspond to the optimization objectives for the respective Multi-Edge LDPC subcodes. The transmitter (either the Mobile Device or Base Station) first sends a training sequence to the receiver (either Base Station or Mobile Device), then the receiver evaluates the channel and noise characteristics and derives the optimum selection of sub-codes of the "super" Multi-Edge LDPC code to be used for the transmission. The receiver informs the transmitter through signaling about the preferred Multi-Edge LDPC Matrix composition. Then, the transmitter encodes the information bits and maps them onto the Resource Blocks and/or Carriers following the indications by the receiver.

Figure 11:
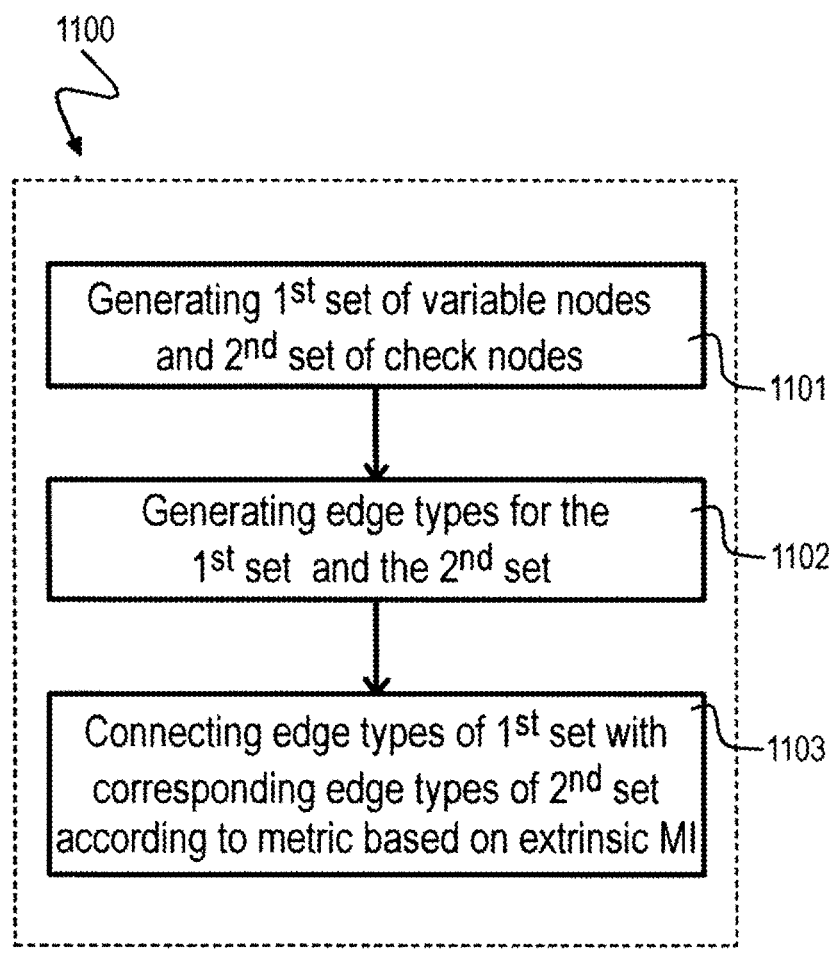
FIG. 11 schematically illustrates an exemplary method 1100 for generating a Multi-Edge LDPC code.

FIG. 11 schematically illustrates an exemplary method 1100 for generating a Multi-Edge LDPC code for encoding a message in a mobile communication system.

The method 1100 includes generating 1101 a first set of variable nodes and a second set of check nodes. The method 1100 includes generating 1102 a plurality of edge types for the first set of variable nodes and the second set of check nodes. The method 1100 includes connecting 1103 an edge type of the variable nodes with a corresponding edge type of the check nodes according to a predetermined metric which is based on extrinsic mutual information exchanged between the first set of variable nodes and the second set of check nodes on each edge type.

The method 1100 may further include deriving the extrinsic mutual information based on edge-perspective degree distributions for each edge type.

The method 1100 may further include deriving the edge-perspective degree distributions for each edge type by partial derivation of node perspective distributions.

The method 1100 may further include deriving the extrinsic mutual information based on extrinsic information exchange (EXIT) charts. The predetermined metric may be configured to minimize the extrinsic mutual information for each edge type.

The method 1100 may further include encoding the message by the multi-edge LDPC code; and transmitting the encoded message over a first transmission path according to a first radio access technology and a second transmission path according to a second radio access technology.

Examples of extrinsic mutual information are described below, in particular with respect to FIGS. 12 and 13. A metric based on mutual information is described in the following sections.

LDPC codes with inherent structure in their associated graph are more optimal than random LDPC codes without any structure. The method 1100 according to the disclosure addresses the problem on how to design structured LDPC codes optimal for a multitude of channels with optimization method of low computational complexity relying on Multi-Edge-Type LDPC codes.

The method 1100 according to FIG. 11 may be used for deriving an optimized Multi-Edge LDPC ensemble of Tanner Graphs for different propagation channels and noise levels. The optimality can be achieved in the sense of threshold (here, the threshold corresponds to the distance of the start of the waterfall region from the theoretical capacity for iterative decoding) maximization.

The following presentation of an exemplary method for generating a Multi-Edge LDPC code according to the disclosure addresses three aspects: For threshold analysis, an optimized novel method called "Multi-Edge Type EXIT Analysis" is introduced. The alternative for evaluating thresholds would be Density Evolution and PEXIT analysis constraint to protographs. The disadvantage of the PEXIT analysis is that it can be used only for protographs and not for general Multi-Edge Type LDPC structures. Density Evolution can theoretically be used, it is however extremely costly in terms of calculation power requirements and thus often impractical.

Second, a novel way of integrating a differential evolutionary optimization algorithm into the upper method for Multi-Edge LDPC threshold optimization is introduced. Existing methods do not allow to be applied for fully parameterized Multi-Edge LDPC threshold optimization and thus the disclosed approach is the only existing valid method known to the authors of this disclosure. In literature, the problem is often reduced to classical single-edge type LDPC codes, however this is sub-optimum.

Third, a solution is introduced for transforming the Multi-Edge Type degree distribution to a specific Multi-Edge Type LDPC code through random interleaving. This solution maintains the structure of the degree distribution derived from the optimization stage.

The disclosed solution, in combination with a heuristic optimization algorithm, allows structuring the LDPC codes in an optimal way for multiple RATs fully exploiting the Multi-Edge-Type framework.

Multi-Edge LDPC codes are a generalization of Single-Edge type LDPC codes. This generalization allows specifying more special LDPC codes than regular and irregular LDPC codes like repeat-accumulating, cyclic, and protograph based LDPC codes. The Multi-Edge framework introduces new constraints to specify the graph of LDPC codes. These Multi-Edge constrained graphs allow the design of single LDPC codes with highly different behavior for different parts of the codes e.g. the sub-codes.

This is a key property of the method 1100 according to the disclosure. Those different parts are exploited in order to optimize sub-codes (together with the overall code) for sub-channels with distinct channel gain properties.

In the extreme case where each edge in the graph has a unique edge-type an individual LDPC code is specified. The following constraints are introduced by the framework: Multiple edge-types are introduced into the graph which enables the guidance of the interconnection between codeword bits and associated parity check equations. Each codeword bit can be assigned an arbitrary channel input. To specify punctured codeword bits the channel input value zero can be assigned.

Various performance aspects of LDPC codes like threshold performance, error floor levels and decoding complexity can be optimized through this framework. The threshold performance of Multi-Edge LDPC codes is assessable through Multi-Edge density evolution and through Multi-Edge EXIT (Extrinsic Information Transfer) analysis. Error floor levels depend on the interconnection between codeword bits and associated parity check equations. Decoding complexity is dependent on the number of interconnections per codeword bit/parity check equation.

The presentation of the new approach is structured as follows: Evaluation of Multi-Edge-Type degree distributions through the introduced Multi-Edge-Type EXIT chart analysis; Optimization of Multi-Edge-Type degree distributions through an optimized heuristic, evolutionary algorithm with the following process inputs and outputs.

The Inputs are: Target number of Edge-Types and target number of Channels, Target SNR for each of the channels, Bit distribution and Target Code Rate. Target number of Edge-Types and target number of Channels may be e.g., 2 channels with different SNR characteristics. Typically, the target number of Edge-Types and target number of Channels are equal, i.e. there is one Edge-Type for each Channel Type. Target SNR for each of the channels may be e.g., 0.5 dB & 1.5 dB. Bit distribution may be e.g. 40% of bits on channel 1 and 60% of bits on channel 2. Note that the total number of bits does not need to be given in the node distribution optimization phase.

The Expected Outputs are Degree Distribution (in form of a discrete probability density function) for each of the variable nodes and parity check nodes for each of the Edge Types.

An Example of the optimization is given in the following: Variable node distribution $L=0.5r_1x_1^7x_2^3+0.5r_2x_2^{10}$ and Check node distribution $R=0.5x_1^7x_2^{13}$ (Note that the sum of weights is typically <1 for Check Nodes, in the example of a factor "0.5", the number of Check Nodes corresponds to half of the number of Variable Nodes). In this example, half of the variable nodes have degree 7 of Edge Type 1 combined with degree 3 of Edge Type 2 and are associated with channel-1. The other halve of the variable nodes has degree 10 of Edge Type 2 and are associated with channel-2.

Furthermore, it is described how a specific Multi-Edge LDPC Code is derived based on the Degree Optimization procedure.

Details are given in the sequel.

The iterative decoding threshold value of MET ensembles (i.e. the channel SNR for which a LDPC code under iterative decoding enters its waterfall region) may be computed by tracking the extrinsic mutual information exchanged between variable nodes and check nodes on each edge-type.

As a first step the edge-perspective degree distributions $\lambda$ and $\rho$ for each edge-type may be derived from the node-perspective distributions L and R by special partial derivation of L and R of each edge-type, where the exponent of the derived edge-type is not decreased by one. Generic examples for $\lambda$ and $\rho$ are given in the following tables:

TABLE 3.1

Generic MET Parameters for $\lambda^{(k)}$

| $\lambda_{d_{v1}}^{(k)}$ | $r^{b_1}$ | $d_1^{(1)}$ | $d_1^{(2)}$ | ... | $d_1^{(T)}$ |
|---|---|---|---|---|---|
| $\lambda_{d_{v2}}^{(k)}$ | $r^{b_2}$ | $d_2^{(1)}$ | $d_2^{(2)}$ | ... | $d_2^{(T)}$ |
| ... | ... | ... | ... | ... | ... |
| $\lambda_{d_{n_v}}^{(k)}$ | $r^{b_{n_v}}$ | $d_{n_v}^{(1)}$ | $d_{n_v}^{(2)}$ | ... | $d_{n_v}^{(T)}$ |

TABLE 3.2

Generic MET Parameters for $\rho^{(k)}$

| $\rho_{d_{c1}}^{(k)}$ | $d_1^{(1)}$ | $d_1^{(2)}$ | ... | $d_1^{(T)}$ |
|---|---|---|---|---|
| $\rho_{d_{c2}}^{(k)}$ | $d_2^{(1)}$ | $d_2^{(2)}$ | ... | $d_2^{(T)}$ |
| ... | ... | ... | ... | ... |
| $\rho_{d_{n_c}}^{(k)}$ | $d_{n_c}^{(1)}$ | $d_{n_c}^{(2)}$ | ... | $d_{n_c}^{(T)}$ |

$\lambda$ and $\rho$ are the discrete probability function values for each node degree type. r are the associated channel inputs and d are the degrees for each edge-type for the node degree types.

The following equations can be used to track the Gaussian approximated densities of the messages which are exchanged under iterative decoding. $I_{v,l}^{(k)}$ is the extrinsic mutual information (EMI) sent from variable nodes to check nodes (depending on channel mutual information and the EMI sent from check nodes to variable nodes) and is computed for iteration l and edge-type k as:

$$I_{v,l}^{(k)} = \sum_{d=d_{v1}}^{d_{n_v}} \lambda_d^{(k)} \cdot J\left(\sqrt{J^{-1}(I_{l,b})^2 + (d^{(k)} - 1)(J^{-1}(I_{c,l}^{(k)}))^2 + \sum_{\substack{(t)=1 \\ t \neq (k)}}^{T} (d^{(t)}) \cdot J^{-1}(I_{c,l}^{(t)})^2}\right). \quad (3.1)$$

The inputs are the channels mutual information $I_r$. The J function computes the channel mutual information from the channel variance based on the channel SNR. The J function and its inverse $J^{-1}$ are given in the literature for AWGN channel and can be used for Rayleigh fading channels.

$I_{c,l}^{(k)}$ is the extrinsic mutual information(EMI) sent from check nodes to variable nodes (depending on the EMI sent from variable nodes to check nodes) and is computed for iteration l and edge-type k as:

$$I_{c,l}^{(k)} \approx \sum_{d=d_{v1}}^{d_{n_c}} \rho_d^{(k)}\left(1 - J\left(\sqrt{(d^{(k)}-1)\left(J^{-1}(1-I_{v,l-1}^{(k)})^2 + \sum_{\substack{(t)=1 \\ t \neq (k)}}^{T}(d^{(t)}+1) \cdot J^{-1}(1-I_{v,l-1}^{(t)})^2\right)}\right)\right) \quad (3.2)$$

Both equations enable the threshold computation of Multi-Edge-Type degree distributions by tracking the EMI for given channel SNR values over sufficient iterations. If the EMI of the variable nodes eventually converges to one, the channel SNR values are over the degree distribution threshold values. This behavior is shown in the two "Multi-Edge-Type" extrinsic information exchange (EXIT) charts depicted in FIGS. 12 and 13 for a degree distribution with two different edge-types. In the first one (FIG. 12), channel SNR values are above the ensemble thresholds $SNR^{th1}$ and $SNR^{th2}$. The variable node EMI converges to one. In the second (FIG. 13), channel SNR values are below threshold values and variable node EMI converges to a value smaller than one.

To guide the following optimization process, the area between variable node curve and check node curve is approximated as follows. Any other approximation procedure can also be used.

$$A^{(k)} = \sum_{l=1}^{l=l_{max}-1}\left(\frac{1}{2}(I_{v,l+1} - I_{v,l}) + I_{v,l}\right)(I_{c,l+1} - I_{c,l}) - \sum_{l=2}^{l=l_{max}}\left(\frac{1}{2}(I_{v,l+1} - I_{v,l}) + I_{v,l}\right)(I_{c,l+2} - I_{c,l+1}) \quad (3.3)$$

For the optimization of the Multi-Edge-Type degree distributions a modified mixed-integer-discrete-continuous differential evolution algorithm may be used.

The main phases of this algorithm are: 1. Initialization: A number of NP ensembles (i.e. L+R) are either randomly generated or chosen from previous optimization runs to form the first generation G. The channel SNRs ($SNR_1$, $SNR_2$, $SNR_3$, etc.) and other channel characteristics (Rayleigh factors etc.) are set to values above the combined channel capacity. The best ensemble is determined according to the cost function specified in step 3 and labeled $x_{best}$.

Crossover: A number of NP new candidates v for generation G+1 are created from the current generation G ensembles.

The crossover operation creating new variables for candidates may be based with probability of $or_j > O_R$ on $x_{best}$ and the variable differences between random ensembles $x_b$ and $x_c$. $or_j$ is a random variable drawn for each candidate v while $O_R$ is fixed throughout the code design process or varied with lower frequency than $or_j$.

Furthermore, the ensembles are based on a random ensemble $x_a$ and the differences of random ensembles $x_b$ and $x_c$ with probability or $or_j \leq O_R$.

A variable (i.e. node fraction or node degree) of candidate $v_j$ is either directly copied from generation G's ensemble $x_j$ or based on the crossover operation using variable differences with probability $cr_{i,j} > C_R$.

$cr_{i,j}$ is a random variable drawn for each variable of the candidate v while $C_R$ is fixed throughout the code design process or varied with lower frequency than $cr_{i,j}$.

The procedure for the i-th variable of the j-th ensemble in G generating variable $V_{i,j}$ as candidate for G+1 is:

$$v_{i,j}^{(G+1)} = \begin{cases} x_{i,best}^{(G)} + F(x_{i,b}^{(G)} - x_{i,c}^{(G)}) & \text{if } cr_{i,j} < C_R \text{ and } or_j > O_R \\ x_{i,a}^{(G)} + F(x_{i,b}^{(G)} - x_{i,c}^{(G)}) & \text{if } cr_{i,j} < C_R \text{ and } or_j \leq O_R \\ x_{i,j}^{(G)} & \text{else} \end{cases}$$

Selection: The candidates are selected as members G+1 according to, if they can be decoded at the channel SNRs, their VN/CN curve area and how well they satisfy the socket constraints, receive constraints and rate constraint associated with multi-edge type ensembles. The cost computed according to the disclosed Multi-Edge-Type EXIT chart analysis may be written as:

$$f_{thres} = \begin{cases} \Sigma_{k=1}^T A^{(k)} & \text{if } SNR_s^{th} < SNR_s, \forall s = (1, \ldots, D) \\ c_t & \text{else.} \end{cases}$$

If an ensemble can be decoded at current SNRs, its VN/CN curve area summed over all edge types is used. If it cannot be decoded at current SNRs, it is associated with cost $c_t$ which is usually set very high to discourage further using this ensemble. For threshold analysis, the ensembles are transformed from the node perspective L and R to the edge perspective $\lambda$ and $\sigma$.

The threshold cost $f_{thres}$ combines the absolute deviation values for socket constraints $\epsilon_{soc}$ over all edge-types, absolute deviation values for receive constraints over all different channels $\epsilon_{rec}$ and the absolute deviation from the rate constraint $\epsilon_{rat}$ to derive the total ensemble cost as:

$$f_{cost}(x) = (f_{thres}(x) + c_p) \cdot \prod_{k=1}^{T}(\epsilon_{soc}^{(k)} r_{soc})^{p_{soc}} \cdot \prod_{s=1}^{D}(\epsilon_{rec}^s r_{rec})^{p_{rec}} \cdot (\epsilon_{rat} r_{rat})^{p_{rat}}$$

The parameters r and p are used to increase the penalty for constraint deviations linearly and exponentially. Increases in the number of edge-types and increases in the number of channels usually make increases in $r_{soc}/p_{soc}$ and $r_{rec}/p_{rec}$ necessary. $C_p$ is a constant factor ensuring that constraint deviations are not weighted arbitrary strong as $f_{thres}(x)$ decreases. The j-th candidate is selected for G+1 if $f_{cost}(v_j) \leq f_{cost}(x)$. Else $x_j$ from G is kept for G+1.

Repetition: Phases 2, 3, 4 may be repeated till $f_{cost}(x_{best})$ decreased below a certain value (i.e. is good enough). For the case that $f_{cost}(x_{best})$ is good enough, the channel SNRs may be decreased and the repetitions are restarted at the crossover phase. If crossover and selection do yield good enough ensembles after an evolutionary iteration limit, the optimization process may be stopped and LDPC codes can be constructed from the degree distributions L and R.

In the following, Construction of a specific Multi-Edge LDPC Code based on the Degree Distributions from the Optimization procedure is described.

The parity check matrix H for a multi-edge LDPC code with block length n may be generated by the novel multi-edge type edge-interleaver. First, each of the n columns (i.e. variable nodes of the Tanner graph) of H are set to zero and associated with their respective channel inputs. Then each column is filled according to the variable node degree distribution L at random positions with 1s for edge-type-1 with 2s for edge-type-2 etc. For the example of $L=0.5r_1x_1^7x_2^3+0.5r_2x_2^{10}$, the first n/2 columns are associated with channel-1, each of these columns has 7 1s at random positions and 3 2 s at random mutually different positions. The remaining n/2 columns are associated with channel-2, each of these columns has 10 2s at random positions. Afterward, the rows of H are normalized to the check node degree distribution R. For this, the deviation from R is computed for each row (i.e. how many 1s, 2s etc. are actually in each row minus the number of edge-type-1, edge-type-1 etc. specified by R).

Beginning at the first row: If a row has x too many edges of an edge-type-y, x column positions with this edge-type are randomly chosen from within this row. Along these columns, from the current rows position downwards, the edge-type-y is exchanged with a 0 from a random position.

If a row has x too few edges of an edge-type-y, x column positions with a 0 are randomly chosen from within this row. Along these columns, from the current rows position downwards, the 0 is exchanged with a edge-type-y from a random position. This guarantees that the optimal structure defined by L and R is in the parity check matrix H. Finally, all edges (i.e. 1s, 2s, etc.) are rounded to 1.

The novel method as described above may also be referred to as "Multi-Edge Type EXIT Analysis" for deriving a Multi-Edge Type degree distribution that is optimized for a given set of SINR values. A differential evolutionary optimization algorithm may be integrated into the upper method for Multi-Edge LDPC threshold optimization. The Multi-Edge Type degree distribution may be transformed to a specific Multi-Edge Type LDPC code through random interleaving. This solution maintains the structure of the degree distribution derived from the optimization stage. The transforming the Multi-Edge Type degree distribution to a specific Multi-Edge Type LDPC code may be performed through random interleaving. This solution maintains the structure of the degree distribution derived from the optimization stage.

Figure 12:
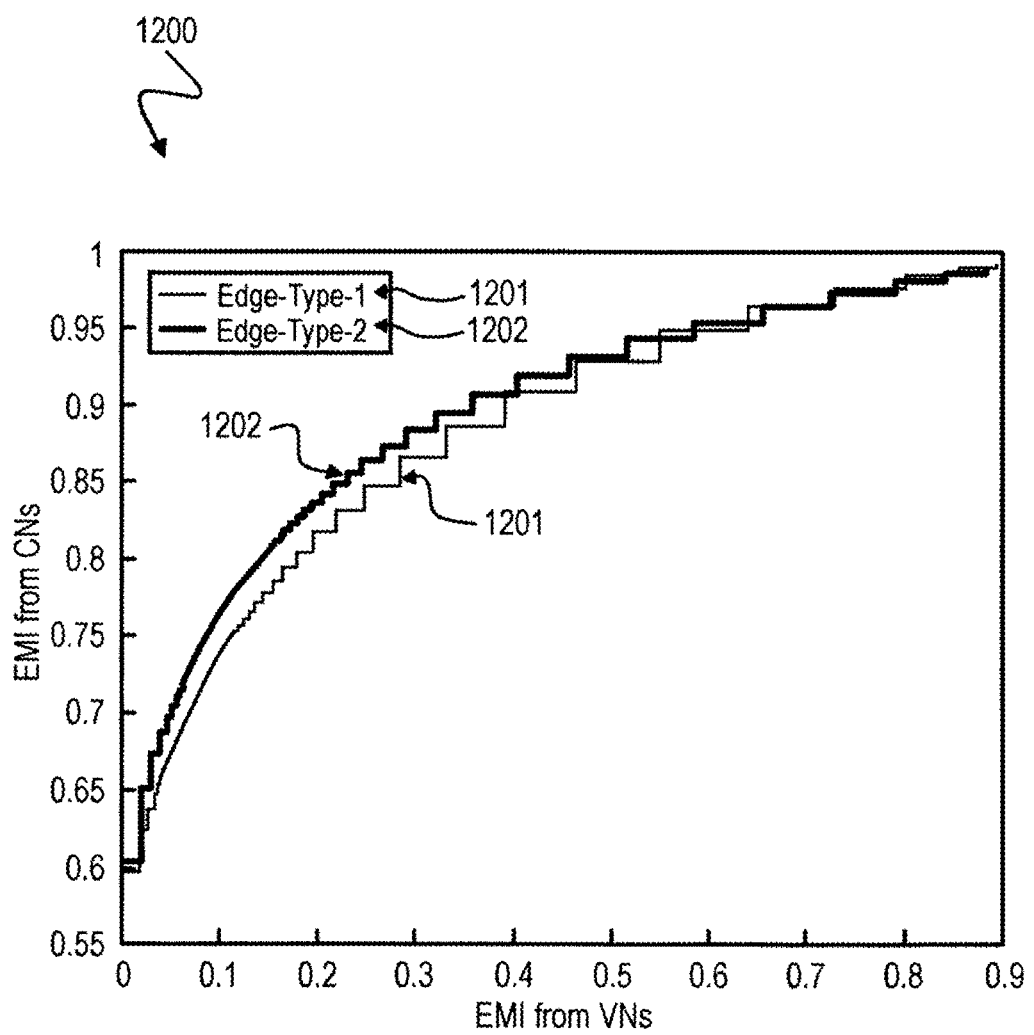
FIG. 12 is a graph illustrating an exemplary extrinsic information exchange (EXIT) chart 1200 for a degree distribution of a first edge type.

FIG. 12 is a graph illustrating an exemplary extrinsic information exchange (EXIT) chart 1200 for a degree distribution of a first edge type. The first curve 1201 depicts extrinsic mutual information (EMI) from check nodes (CN) versus extrinsic mutual information from variable nodes (VN) for edge-type 1. The second curve 1202 depicts extrinsic mutual information (EMI) from check nodes (CN) versus extrinsic mutual information from variable nodes (VN) for edge-type 2.

In the EXIT chart of FIG. 12, channel SNR values are above the ensemble thresholds $SNR^{th1}$ and $SNR^{th2}$. The variable node EMI converges to one.

Figure 13:
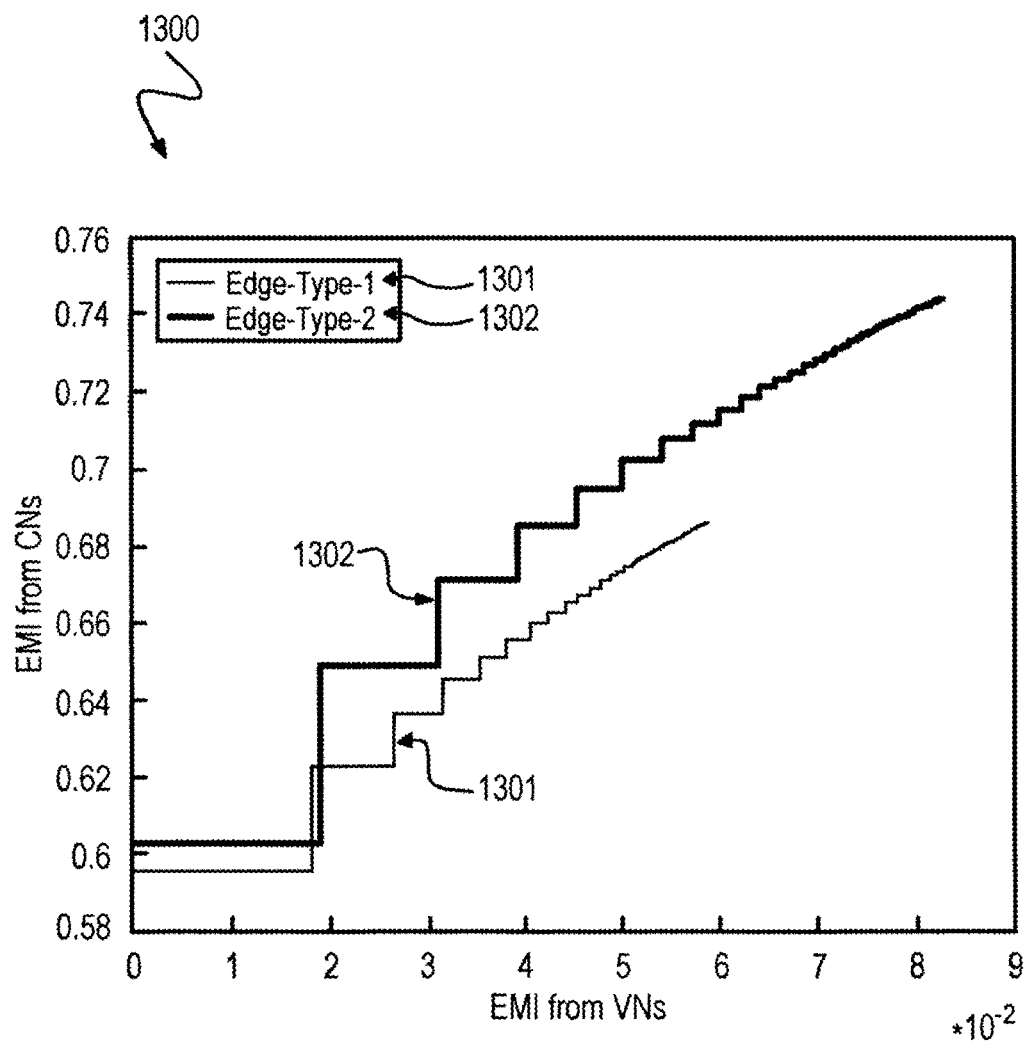
FIG. 13 is a graph illustrating an exemplary extrinsic information exchange (EXIT) chart 1300 for a degree distribution of a second edge type.

FIG. 13 is a graph illustrating an exemplary extrinsic information exchange (EXIT) chart 1300 for a degree distribution of a second edge type. The first curve 1301 depicts extrinsic mutual information (EMI) from check nodes (CN) versus extrinsic mutual information from variable nodes (VN) for edge-type 1. The second curve 1302 depicts extrinsic mutual information (EMI) from check nodes (CN) versus extrinsic mutual information from variable nodes (VN) for edge-type 2. These curves show the extrinsic information for a given edge type (as mentioned above). In one approach (that may be sub-optimal), the difference between the curves of a given edge type may be optimized. In a second approach (that may be the optimal case) a "surface" (or other shape) may be used representing the extrinsic information of all given edge types and the difference between those shapes (which can be a volume or similar) is minimized. Both approaches can be applied with their inherent properties.

In the EXIT chart of FIG. 13, channel SNR values are below threshold values and variable node EMI converges to a value smaller than one.

The methods, systems and devices described herein may be implemented as software in a Digital Signal Processor (DSP), in a micro-controller or in any other side-processor or as hardware circuit on a chip or within an application specific integrated circuit (ASIC).

Embodiments described in this disclosure can be implemented in digital electronic circuitry, or in computer hardware, firmware, software, or in combinations thereof, e.g. in available hardware of mobile devices or in new hardware dedicated for processing the methods described herein.

The present disclosure also supports a computer program product including computer executable code or computer executable instructions that, when executed, causes at least one computer to execute the performing and computing blocks described herein, in particular the methods 1000 and 1100 as described above with respect to FIGS. 10 and 11. Such a computer program product may include a readable storage medium storing program code thereon for use by a processor, the program code comprising instructions for performing any of the method 1000, 1100 as described above.

EXAMPLES

The following examples pertain to further embodiments. Example 1 is a mobile communication system, comprising: a first transmission path configured to transmit a message according to a first radio access technology; a second transmission path configured to transmit the message according to a second radio access technology; an encoder configured to encode the message by a code before transmission of the message over the first transmission path and the second transmission path, wherein the code comprises at least two subcodes, and wherein the encoder is configured to encode the message intended for transmission over the first transmission path with a first subcode of the at least two subcodes and to encode the message intended for transmission over the second transmission path with a second subcode of the at least two subcodes.

In Example 2, the subject matter of Example 1 can optionally include that a channel code of the first radio access technology is a multi-Edge Low Density Parity Check (LDPC) code from the beginning; or that the channel code of the first radio access technology is a multi-Edge LDPC code as a replacement code for an original channel code different from a multi-Edge LDPC code.

In Example 3, the subject matter of any one of Examples 1-2 can optionally include that the first radio access technology is a technology based on LDPC codes, in particular one of IEEE 802.11ac or IEEE 802.11n; and that the second radio access technology is a millimeter wave radio access technology.

In Example 4, the subject matter of any one of Examples 1-3 can optionally include that the code comprising the at least two subcodes comprises a multi-edge low density parity check (LDPC) code and that each subcode corresponds to a different edge-type having a specific node degree distribution.

In Example 5, the subject matter of Example 4 can optionally include that the first subcode is based on a signal to interference and noise characteristic of the first transmission path; that the second subcode is based on a signal to interference and noise characteristic of the second transmission path; and that the first subcode and the second subcode are optimized with respect to an observed multi-path propagation profile.

In Example 6, the subject matter of Example 4 can optionally include that the message comprises a plurality of data containers; and that the first subcode is allocated to a first data container of the plurality of data containers and the second subcode is allocated to a second data container of the plurality of data containers.

In Example 7, the subject matter of Example 6 can optionally include that the allocation of the first subcode to the first data container is based on a signal-to-interference and noise ratio (SINR) of the first data container.

In Example 8, the subject matter of Example 7 can optionally include that the first subcode is designed for allocation to a data container of the plurality of data containers in which an SINR is above a first SINR level; and that the second subcode is designed for allocation to a data container of the plurality of data containers in which an SINR is below a second SINR level.

Example 9 is a mobile receiver, comprising: a receiving circuit, configured to receive a signal comprising transmissions from a serving radio cell and a plurality of interfering radio cells, wherein the signal is encoded by a code comprising a plurality of subcodes; and a detection circuit configured to detect a first interference scenario based on decoding the signal with a first subcode of the plurality of subcodes and to detect a second interference scenario based on decoding the signal with a second subcode of the plurality of subcodes.

In Example 10, the subject matter of Example 9 can optionally include that the receiving circuit is configured to receive the signal comprising a plurality of resource blocks, wherein a particular subcode of the plurality of subcodes is allocated to a respective resource block of the plurality of resource blocks.

In Example 11, the subject matter of Example 10 can optionally include that the particular subcode allocated to the respective resource block depends on a channel gain of the respective resource block.

In Example 12, the subject matter of any one of Examples 9-11 can optionally include that the first subcode is adapted for the first interference scenario and the second subcode is adapted for the second interference scenario.

In Example 13, the subject matter of any one of Examples 9-11 can optionally include that the code comprises a multi-edge low density parity check (LDPC) code comprising a plurality of multi-edge LDPC subcodes.

Example 14 is a method for generating a super low density parity check (LDPC) code based on an LDPC code comprising a first set of variable nodes and a second set of check nodes, the method comprising: generating a plurality of edge types for the first set of variable nodes and the second set of check nodes, each edge type depending on a particular radio access technology of a set of radio access technologies and a channel profile of the particular radio access technology; connecting a particular edge type of the variable nodes with a corresponding edge type of the check nodes according to a particular subcode of the LDPC code; and generating the super low density parity check (LDPC) code based on the edge type connections of the plurality of edge types.

In Example 15, the subject matter of Example 14 can optionally include that the particular subcode of the LDPC code is optimized for the particular radio access technology and the channel profile of the particular radio access technology.

In Example 16, the subject matter of any one of Examples 14-15 can optionally include: generating the channel profile of the particular radio access technology as a step function representing a statistical distribution of channel gains of the particular radio access technology in a quantized representation.

In Example 17, the subject matter of any one of Examples 14-16 can optionally include: identifying the set of radio access technologies based on radio access technologies that can be combined in a transmitter or receiver pair and based on a required link characteristic of the transmitter or receiver pair.

In Example 18, the subject matter of any one of Examples 14-17 can optionally include that the LDPC code comprises a multi-edge LDPC code comprising a plurality of multi-edge LDPC subcodes.

In Example 19, the subject matter of any one of Examples 14-18 can optionally include: generating the super low density parity check (LDPC) code as a matrix comprising all edge type connections of the plurality of edge types.

Example 20 is a method for generating a multi-edge LDPC code for encoding a message in a mobile communication system, the method comprising: generating a first set of variable nodes and a second set of check nodes; generating a plurality of edge types for the first set of variable nodes and the second set of check nodes; and connecting an edge type of the set of variable nodes with a corresponding edge type of the check nodes according to a predetermined metric that is based on extrinsic mutual information exchanged between the first set of variable nodes and the second set of check nodes on each edge type.

In Example 21, the subject matter of Example 20 can optionally include: deriving the extrinsic mutual information based on edge-perspective degree distributions for each edge type.

In Example 22, the subject matter of Example 21 can optionally include: deriving the edge-perspective degree distributions for each edge type by partial derivation of node perspective distributions.

In Example 23, the subject matter of any one of Examples 20-22 can optionally include: deriving the extrinsic mutual information based on extrinsic information exchange (EXIT) charts.

In Example 24, the subject matter of any one of Examples 20-23 can optionally include that the predetermined metric is configured to minimize the extrinsic mutual information for each edge type.

In Example 25, the subject matter of any one of Examples 20-24 can optionally include: encoding the message by the multi-edge LDPC code; and transmitting the encoded message over a first transmission path according to a first radio access technology and a second transmission path according to a second radio access technology.

Example 26 is a computer readable medium on which computer instructions are stored which when executed by a computer, cause the computer to perform the method of one of Examples 14 to 25.

Example 27 is a device for generating a super low density parity check (LDPC) code based on an LDPC code comprising a first set of variable nodes and a second set of check nodes, the device comprising: means for generating a plurality of edge types for the first set of variable nodes and the second set of check nodes, each edge type depending on a particular radio access technology of a set of radio access technologies and a channel profile of the particular radio access technology; means for connecting a particular edge type of the variable nodes with a corresponding edge type of the check nodes according to a particular subcode of the LDPC code; and means for generating the super low density parity check (LDPC) code based on the edge type connections of the plurality of edge types.

In Example 28, the subject matter of Example 27 can optionally include means that is configured to optimize the particular subcode of the LDPC code for the particular radio access technology and the channel profile of the particular radio access technology.

In Example 29, the subject matter of any one of Examples 27-28 can optionally include: means for generating the channel profile of the particular radio access technology as a step function representing a statistical distribution of channel gains of the particular radio access technology in a quantized representation.

In Example 30, the subject matter of any one of Examples 27-29 can optionally include: means for identifying the set of radio access technologies based on radio access technologies that can be combined in a transmitter/receiver pair and based on a required link characteristic of the transmitter/receiver pair.

In Example 31, the subject matter of any one of Examples 27-30 can optionally include that the LDPC code comprises a multi-edge LDPC code comprising a plurality of multi-edge LDPC subcodes.

In Example 32, the subject matter of any one of Examples 27-31 can optionally include: means for generating the super low density parity check (LDPC) code as a matrix comprising all edge type connections of the plurality of edge types.

Example 33 is a device for generating a multi-edge LDPC code for encoding a message in a mobile communication system, the device comprising: means for generating a first set of variable nodes and a second set of check nodes; means for generating a plurality of edge types for the first set of variable nodes and the second set of check nodes; and means for connecting an edge type of the variable nodes with a corresponding edge type of the check nodes according to a predetermined metric which is based on extrinsic mutual information exchanged between the first set of variable nodes and the second set of check nodes on each edge type.

In Example 34, the subject matter of Example 33 can optionally include: means for deriving the extrinsic mutual information based on edge-perspective degree distributions for each edge type.

In Example 35, the subject matter of Example 34 can optionally include: means for deriving the edge-perspective degree distributions for each edge type by partial derivation of node perspective distributions.

In Example 36, the subject matter of any one of Examples 33-35 can optionally include: means for deriving the extrinsic mutual information based on extrinsic information exchange (EXIT) charts.

In Example 37, the subject matter of any one of Examples 33-36 can optionally include that the predetermined metric is configured to minimize the extrinsic mutual information for each edge type.

In Example 38, the subject matter of any one of Examples 33-37 can optionally include: means for encoding the message by the multi-edge LDPC code; and means for transmitting the encoded message over a first transmission path according to a first radio access technology and a second transmission path according to a second radio access technology.

Example 39 is a system, comprising: a receiving device, configured to receive a signal comprising transmissions from a serving radio cell and a plurality of interfering radio cells, wherein the signal is encoded by a code comprising a plurality of subcodes; and a detection device configured to detect a first interference scenario based on decoding the signal with a first subcode of the plurality of subcodes and to detect a second interference scenario based on decoding the signal with a second subcode of the plurality of subcodes.

In Example 40, the subject matter of Example 39 can optionally include that the receiving device is configured to receive the signal comprising a plurality of resource blocks, wherein a particular subcode of the plurality of subcodes is allocated to a respective resource block of the plurality of resource blocks.

In Example 41, the subject matter of Example 40 can optionally include that the particular subcode allocated to the respective resource block depends on a channel gain of the respective resource block.

In Example 42, the subject matter of any one of Examples 39-41 can optionally include that the first subcode is adapted for the first interference scenario and the second subcode is adapted for the second interference scenario.

In Example 43, the subject matter of any one of Examples 39-41 can optionally include that the code comprises a multi-edge low density parity check (LDPC) code comprising a plurality of multi-edge LDPC subcodes.

In Example 44, the subject matter of any one of Examples 39-43 can optionally include that the system is implemented as an on-chip system.

In addition, while a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it is understood that aspects of the disclosure may be implemented in discrete circuits, partially integrated circuits or fully integrated circuits or programming means. Also, the terms "exemplary", "for example" and "e.g." are merely meant as an example, rather than the best or optimal.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A mobile communication system, comprising:
a first transmission path configured to transmit a message according to a first radio access technology;
a second transmission path configured to transmit the message according to a second radio access technology; and
an encoder configured to encode the message via a code block before transmission of the message over the first transmission path and the second transmission path,
wherein the code block comprises at least a first code block portion and a second code block portion, and
wherein the encoder is configured to encode the message intended for transmission over the first transmission path with the first code block portion, and to encode the message intended for transmission over the second transmission path with the second code block portion.

2. The mobile communication system of claim 1, wherein a channel code of the first radio access technology is a Low Density Parity Check (LDPC) code.

3. The mobile communication system of claim 1, wherein at least one of the first radio access technology or the second radio access technology is a millimeter wave radio access technology.

4. The mobile communication system of claim 1, wherein the message comprises a plurality of data segments,
wherein the first code block portion is allocated to a first data segment of the plurality of data segments, and
wherein the second code block is allocated to a second data segment of the plurality of data segments.

5. A receiver, comprising:
demodulator circuitry configured to receive a message transmitted via a first transmission path according to a first radio access technology and to receive the message transmitted via a second transmission path according to a second radio access technology,
wherein the message is encoded by a code block comprising at least a first code block portion and a second code block portion; and
decoder circuitry configured to decode the message by allocating the first code block portion to a first segment of the message and allocating the second code block portion to a second segment of the message.

6. The receiver of claim 5, wherein the code block comprises a low density parity check (LDPC) code.

7. The receiver of claim 5, wherein at least one of the first radio access technology or the second radio access technology is a millimeter wave radio access technology.

8. The receiver of claim 5, wherein at least one of the first radio access technology or the second radio access technology is a long-term evolution (LTE) radio access technology.

9. The receiver of claim 5, wherein the message is encoded by the code block comprising at least the first code block portion and the second code block portion before transmission of the message over the first transmission path and the second transmission path, the message for transmission over the first transmission path being encoded with the first code block portion, and the message for transmission over the second transmission path being encoded with the second code block portion.

10. A transmitter, comprising:
encoder circuitry configured to encode a message via a code block prior to transmission of the message over a first transmission path and a second transmission path;
first modulator circuitry configured to transmit the message via the first transmission path according to a first radio access technology; and
second modulator circuitry configured to transmit the message via the second transmission path according to a second radio access technology,
wherein the code block comprises at least a first code block portion and a second code block portion, and
wherein the encoder circuitry is configured to encode the message intended for transmission over the first transmission path with the first code block portion, and to encode the message intended for transmission over the second transmission path with the second code block portion.

11. The transmitter of claim 10, wherein at least one of the first radio access technology or the second radio access technology is a millimeter wave radio access technology.

12. The transmitter of claim 10, wherein the message comprises a plurality of data segments,
wherein the first code block portion is allocated to a first data segment of the plurality of data segments, and
wherein the second code block is allocated to a second data segment of the plurality of data segments.

13. The transmitter of claim 10, wherein at least one of the first radio access technology or the second radio access technology is a long-term evolution (LTE) radio access technology.

* * * * *